(12) United States Patent
Gyoda et al.

(10) Patent No.: US 8,450,031 B2
(45) Date of Patent: May 28, 2013

(54) DETERMINATION METHOD, EXPOSURE METHOD AND STORAGE MEDIUM

(75) Inventors: Yuichi Gyoda, Utsunomiya (JP); Hiroyuki Ishii, Shioya-gun (JP); Youzou Fukagawa, Utsunomiya (JP); Yuji Shinano, Berlin (DE)

(73) Assignee: Canon Kabushiki Kaisha (JP)

( * ) Notice: Subject to any disclaimer, the term of this patent is extended or adjusted under 35 U.S.C. 154(b) by 87 days.

(21) Appl. No.: 13/222,628

(22) Filed: Aug. 31, 2011

(65) Prior Publication Data

US 2012/0052448 A1    Mar. 1, 2012

(30) Foreign Application Priority Data

Sep. 1, 2010 (JP) ................ 2010-196093

(51) Int. Cl.
*G03C 5/00*   (2006.01)

(52) U.S. Cl.
USPC ........................................... 430/30; 430/494

(58) Field of Classification Search
USPC .................................. 430/30, 494
See application file for complete search history.

(56) References Cited

FOREIGN PATENT DOCUMENTS

| JP | 2002261004 A | 9/2002 |
|----|--------------|--------|
| JP | 3342631 B | 11/2002 |
| JP | 4378266 B2 | 12/2009 |

OTHER PUBLICATIONS

Matsuyama, et al., "A Study of Source and Mask Optimization for ArF Scanners", Optical Microlithography XXII, SPIE vol. 7274, 2009, pp. 1-8.

*Primary Examiner* — Christopher Young
(74) *Attorney, Agent, or Firm* — Rossi, Kimms & McDowell LLP

(57) ABSTRACT

The present invention provides a determination method of determining a light intensity distribution to be formed on a pupil plane of an illumination optical system in an exposure apparatus, the method including a step of setting a cut line used to evaluate an image of a pattern of a mask, which is formed on an image plane of a projection optical system, and a target value of a dimension of the image, and a step of obtaining the dimension of the image of the pattern on the cut line, and determining a weight to be applied to each of a plurality of element light sources such that the obtained dimension comes close to the target value of the dimension, thereby determining, as the light intensity distribution, light sources obtained by combining the plurality of element light sources applied with the weights.

7 Claims, 14 Drawing Sheets

FIG. 3

| | | | | | R1 | R2 | R3 | R4 | R5 | | | | |
|---|---|---|---|---|---|---|---|---|---|---|---|---|---|
| | | | | R6 | R7 | R8 | R9 | R10 | R11 | R12 | R13 | R14 | |
| | | | R15 | R16 | R17 | R18 | R19 | R20 | R21 | R22 | R23 | R24 | R25 |
| | | R26 | R27 | R28 | R29 | R30 | R31 | R32 | R33 | R34 | R35 | R36 | R37 | R38 |
| | | R39 | R40 | R41 | R42 | R43 | R44 | R45 | R46 | R47 | R48 | R49 | R50 | R51 |
| R52 | R53 | R54 | R55 | R56 | R57 | R58 | R59 | R60 | R61 | R62 | R63 | R64 | R65 | R66 |
| R67 | R68 | R69 | R70 | R71 | R72 | R73 | R74 | R75 | R76 | R77 | R78 | R79 | R80 | R81 |
| R82 | R83 | R84 | R85 | R86 | R87 | R88 | R89 | R90 | R91 | R92 | R93 | R94 | R95 | R96 |
| R97 | R98 | R99 | R100 | R101 | R102 | R103 | R104 | R105 | R106 | R107 | R108 | R109 | R110 | R111 |
| R112 | R113 | R114 | R115 | R116 | R117 | R118 | R119 | R120 | R121 | R122 | R123 | R124 | R125 | R126 |
| | R127 | R128 | R129 | R130 | R131 | R132 | R133 | R134 | R135 | R136 | R137 | R138 | R139 | |
| | R140 | R141 | R142 | R143 | R144 | R145 | R146 | R147 | R148 | R149 | R150 | R151 | R152 | |
| | | R153 | R154 | R155 | R156 | R157 | R158 | R159 | R160 | R161 | R162 | R163 | | |
| | | | R164 | R165 | R166 | R167 | R168 | R169 | R170 | R171 | R172 | | | |
| | | | | | R173 | R174 | R175 | R176 | R177 | | | | | |

F I G. 11
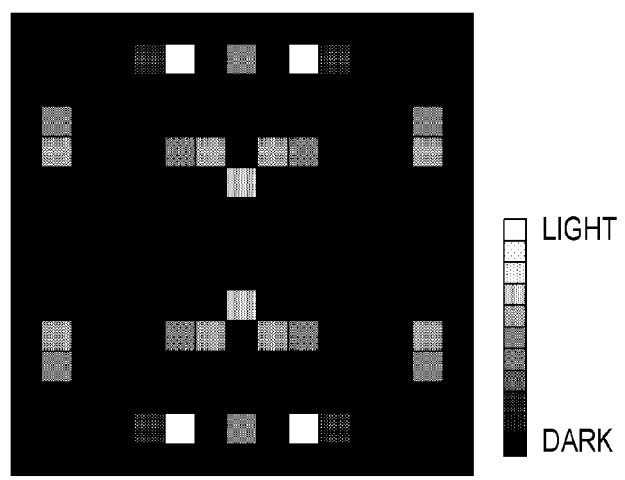
F I G. 12
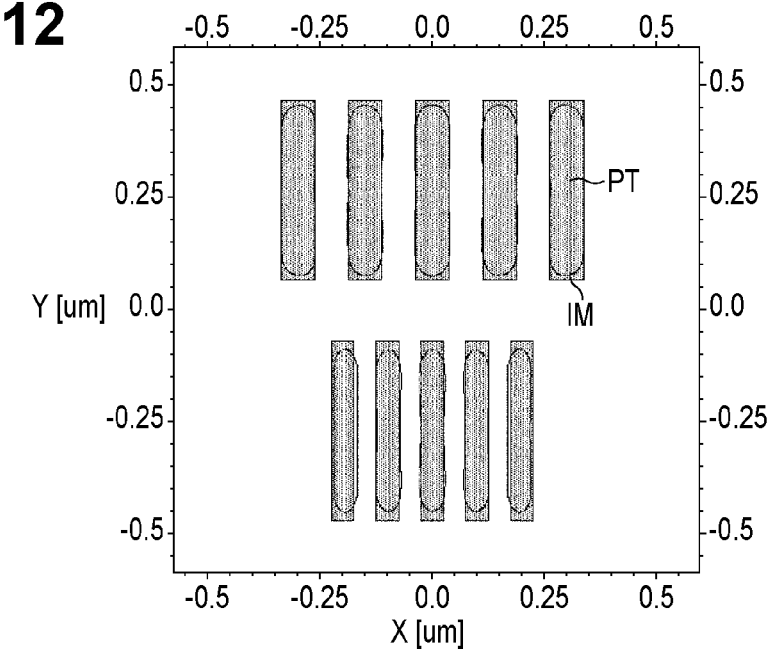
F I G. 13
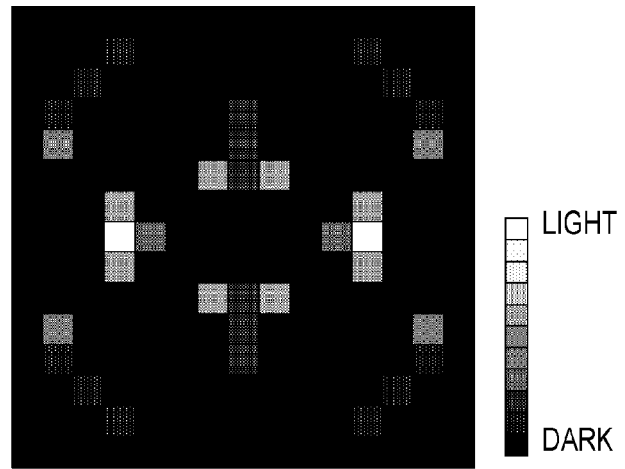

F I G. 21A
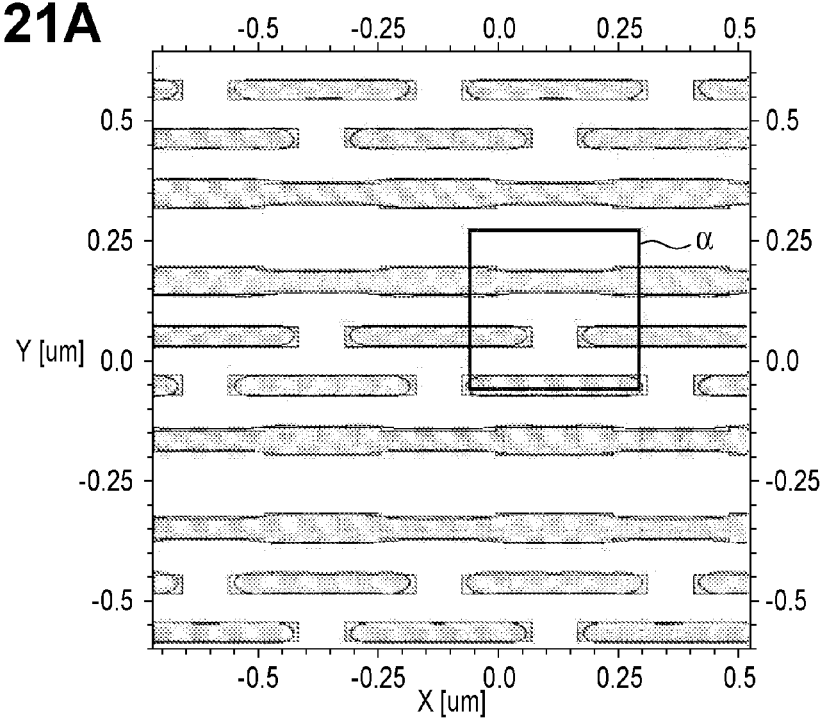
F I G. 21B
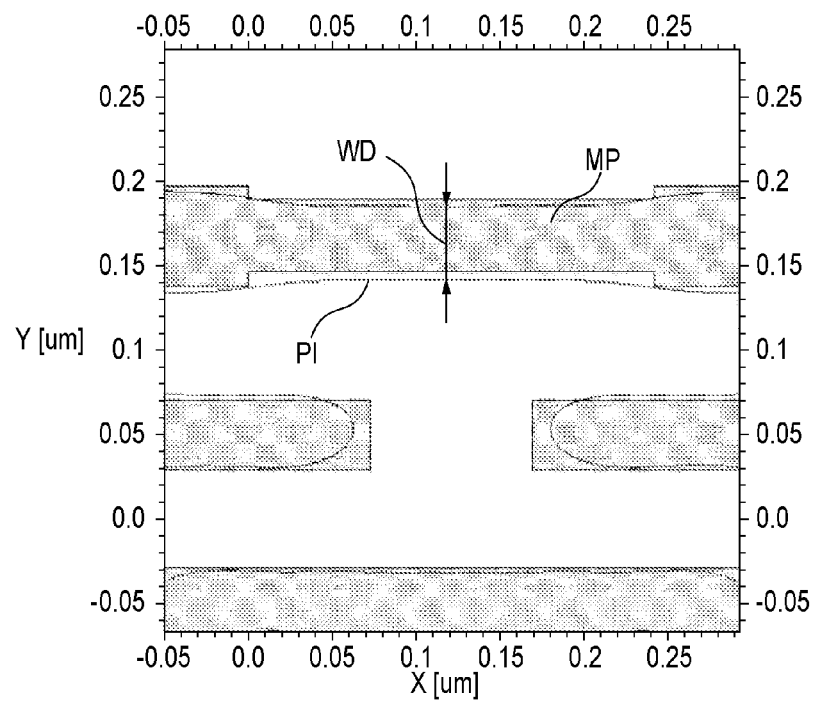

DETERMINATION METHOD, EXPOSURE METHOD AND STORAGE MEDIUM

BACKGROUND OF THE INVENTION

1. Field of the Invention

The present invention relates to a determination method of determining a light intensity distribution (effective light source) to be formed on the pupil plane of an illumination optical system, an exposure method, and a storage medium.

2. Description of the Related Art

An exposure apparatus is employed to fabricate a semiconductor device using a photolithography technique. The exposure apparatus projects and transfers the pattern of a mask (reticle) onto a substrate (for example, a wafer) by a projection optical system. To keep up with the recent advances in micropatterning of semiconductor devices, the exposure apparatus requires a technique of attaining a high resolution.

Because an exposure apparatus cannot always ensure an ideal amount of exposure on the substrate and an ideal focus position, it may transfer a pattern different from that having a desired shape (mask pattern shape) onto a substrate. The amount of exposure deviates from an ideal state due to factors such as instability of a light source and nonuniformity of the illuminance distribution in an illumination region. Also, the focus position deviates from an ideal state due to factors such as instability of the holding position of the substrate and unevenness of the substrate. A model defined by the ranges of amounts of exposure and focus positions, within which a desired pattern can be transferred onto the substrate, is called a process window, and the exposure apparatus requires a technique of attaining a wide process window.

Oblique-incidence illumination, for example, is known as a technique for attaining both a high resolution and a wide process window. In the oblique-incidence illumination, a mask is obliquely irradiated with exposure light using an annular effective light source (the light intensity distribution on the pupil plane of an illumination optical system) or an effective light source with a shape having a plurality of (for example, two or four) poles. The annular effective light source is defined by two degrees of freedom (parameters): the annular zone radius and the annular zone width. Thus, the following technique has been proposed. Pattern images for effective light sources defined by those two degrees of freedom are obtained by simulation while changing them to various values, and an annular zone radius and an annular zone width are selected based on these pattern images, thereby determining an optimum effective light source.

Also, in recent years, T. Matsuyama, et. al., "A Study of Source & Mask Optimization for ArF Scanners", Proc. of SPIE, USA, SPIE, 2009, Vol. 7,274, p. 727,408 (literature 1), proposes a technique which increases the number of degrees of freedom which define the effective light source. In the technique described in literature 1, the pupil plane of an illumination optical system is divided into a plurality of regions in a grid pattern, and light intensities are individually set for the respective divided regions. However, assuming, for example, that the pupil plane of the illumination optical system is divided into 63×63 regions, a thousand or more degrees of freedom are determined. From the viewpoint of the computation time, it is not realistic to obtain pattern images for respective combinations of degrees of freedom defined within such a wide optimization space to determine an optimum effective light source. Although Japanese Patent No. 3342631 proposes a heuristic optimization technique of adjusting the initial value and iterating computation to obtain an optimum solution, this technique may not only require a long computation time but also result in a local solution.

On the other hand, Japanese Patent No. 4378266 and Japanese Patent Laid-Open No. 2002-261004 propose techniques which use mathematical programming in effective light source optimization with such large degrees of freedom. The mathematical programming mathematically guarantees its solution to be optimum, and can shorten the computation time.

The technique described in Japanese Patent No. 4378266 is designed to apply approximation to a maximization problem for the process window to transform this problem into one type of mathematical programming, that is, a linear programming problem to be solved, thereby obtaining a solution. The process window is generally the product of the range of amounts of exposure and that of focus positions, within which the width of a pattern image falls within a tolerance. However, in the technique described in Japanese Patent No. 4378266, the position coordinates of the two side edges of a line pattern image and the ranges of these position coordinates are defined, instead of defining the width (line width) of the line pattern image. Therefore, in the technique described in Japanese Patent No. 4378266, the effective light source is optimized by evaluating the intensities of the line pattern image at the positions at which its two edges are to be positioned (that is, by indirectly evaluating the width of the line pattern image), instead of directly evaluating the width of the line pattern image.

Also, the technique described in Japanese Patent Laid-Open No. 2002-261004 is designed to optimize the effective light source and the mask pattern so that a pattern image having a desired shape is formed. In the technique described in Japanese Patent Laid-Open No. 2002-261004, a two-dimensional pattern to be formed is determined in advance, and a plurality of position coordinates (image points) are set on the two-dimensional pattern. A light state or a dark state is then defined for each of the plurality of position coordinates, and the effective light source and the mask pattern are optimized. Therefore, the technique described in Japanese Patent Laid-Open No. 2002-261004 lacks the concept of the width of the pattern image, like that described in Japanese Patent No. 4378266.

In the techniques described in Japanese Patent No. 4378266 and Japanese Patent Laid-Open No. 2002-261004, the effective light source is optimized in consideration of the light/dark state of the pattern image at each position coordinate in place of the width of the pattern image. Unfortunately, such optimization is inappropriate for actual conditions because the width of the pattern image is of prime importance in evaluating the pattern image. Nevertheless, if the pattern image has bilateral or horizontal symmetry (or vertical symmetry) and the projection optical system has none of factors which act to shift the pattern image, such as distortion and coma, the techniques described in Japanese Patent No. 4378266 and Japanese Patent No. 2002-261004 may pose no problems. This is because if the pattern image is symmetric, the position coordinates of the edges of the pattern image and the width of the pattern image have a one-to-one correspondence between them. However, such a case is rare in practice, and the pattern image shifts (a pattern shift occurs) horizontally (or vertically) with respect to the mask in many cases. When a pattern shift occurs, neither of the techniques described in Japanese Patent No. 4378266 and Japanese Patent Laid-Open No. 2002-261004 can be used to determine an optimum effective light source.

SUMMARY OF THE INVENTION

The present invention provides a technique advantageous to determine a light intensity distribution to be formed on the pupil plane of an illumination optical system.

According to one aspect of the present invention, there is provided a determination method of determining a light intensity distribution to be formed on a pupil plane of an illumination optical system which illuminates a mask in an exposure apparatus including the illumination optical system and a projection optical system which projects a pattern of the mask onto a substrate, the method including a first step of setting the pattern of the mask, a second step of setting a cutline used to evaluate an image of the pattern of the mask, which is formed on an image plane of the projection optical system, and a target value of a dimension of the image, a third step of setting a plurality of element light sources which form on the pupil plane of the illumination optical system, a fourth step of calculating an image of the pattern of the mask, which is formed on the cutline upon illuminating the pattern of the mask, for each of the plurality of element light sources, and a fifth step of determining a weight to be applied to each of the plurality of element light sources such that the dimension of the image of the pattern of the mask on the cutline from the images calculated in the fourth step comes close to the target value of the dimension, thereby determining, as the light intensity distribution to be formed on the pupil plane of the illumination optical system, light sources obtained by combining the plurality of element light sources applied with the weights.

Further features of the present invention will become apparent from the following description of exemplary embodiments with reference to the attached drawings.

BRIEF DESCRIPTION OF THE DRAWINGS

FIG. 3 is a view for explaining element light sources generated in step S108 of the flowchart shown in FIG. 1.

FIG. 11 is a view showing the effective light source determined in step S112 of the flowchart shown in FIG. 1.

FIG. 12 is a view showing an optical image formed on the image plane of a projection optical system upon illuminating the mask pattern shown in FIG. 2 with the effective light source shown in FIG. 11.

FIG. 13 is a view showing the effective light source determined in step S112 of the flowchart shown in FIG. 1.

FIGS. 21A and 21B are views for explaining the importance of evaluating the dimension of the optical image of the pattern to determine an effective light source.

DESCRIPTION OF THE EMBODIMENTS

Figure 1:
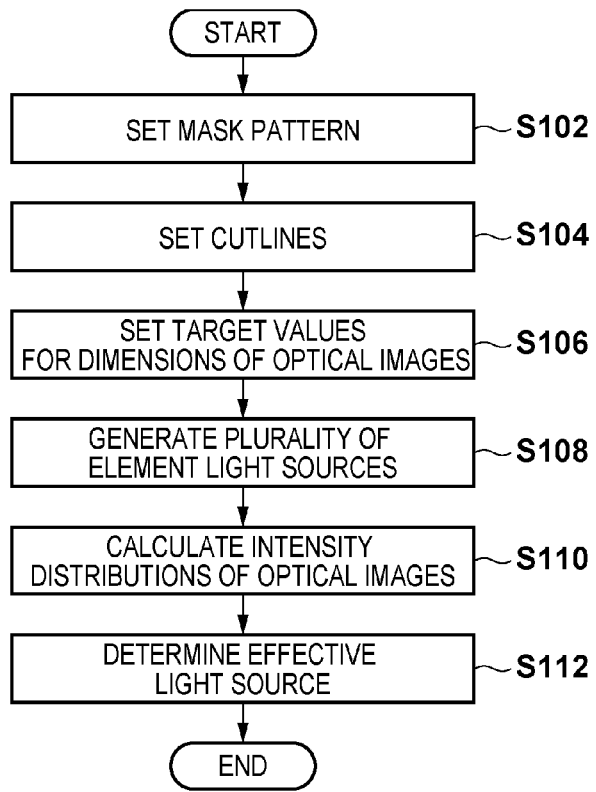
FIG. 1 is a flowchart for explaining a determination method according to an aspect of the present invention.

Preferred embodiments of the present invention will be described below with reference to the accompanying drawings. Note that the same reference numerals denote the same members throughout the drawings, and a repetitive description thereof will not be given.

The present invention is applicable to determination of an effective light source used in micromechanics and in fabricating various devices such as a semiconductor chip such as an IC or an LSI, a display device such as a liquid crystal panel, a detection device such as a magnetic head, and an image sensing element such as a CCD. The micromechanics means herein a technique of creating a micron-scale machinery system with sophisticated functions by applying a semiconductor integrated circuit fabrication technique to microstructure fabrication, or the machinery system itself.

<First Embodiment>

FIG. 1 is a flowchart for explaining a determination method according to an aspect of the present invention. The determination method in this embodiment is executed by an information processing apparatus such as a computer to determine (optimize) an effective light source used to illuminate a mask (reticle) in an exposure apparatus including an illumination optical system which illuminates the mask, and a projection optical system which projects the pattern of the mask onto a substrate. The effective light source means herein a light intensity distribution formed on the pupil plane of the projection optical system while no mask is placed on the object plane of the projection optical system. Therefore, determining an effective light source amounts to determining a light intensity distribution to be formed on the pupil plane of the illumination optical system.

Figure 2:
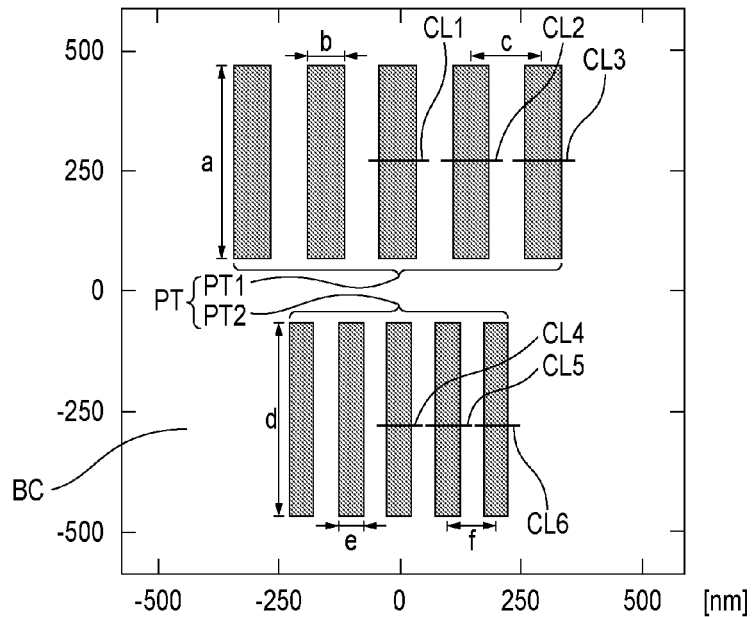
FIG. 2 is a view illustrating an example of a mask pattern set in step S102 of the flowchart shown in FIG. 1.

In step S102, the pattern (mask pattern) of a mask to be placed on the object plane of the projection optical system is set. In this embodiment, a mask pattern including pattern groups PT formed from light-shielding portions, and a background portion BC formed from a light-transmitting portion is set, as shown in FIG. 2. This mask pattern includes two types of line-and-space patterns: a first pattern portion PT1 and a second pattern portion PT2. Line patterns which form the first pattern portion PT1 have a longitudinal dimension a of 400 nm, a widthwise dimension b of 75 nm, and a pitch c of 150 nm. Also, line patterns which form the second pattern portion PT2 have a longitudinal dimension d of 400 nm, a widthwise dimension e of 50 nm, and a pitch f of 100 nm. A mask pattern generally includes various patterns. In step S102, either all types of patterns or necessary patterns included in the mask pattern may be set. Also, although a two-dimensional mask pattern is set in this embodiment, a one- or three-dimensional mask pattern may be set.

In step S104, cutlines (portions of interest) used to evaluate optical images (images formed on the image plane of the projection optical system) of the mask pattern set in step S102 are set. In this embodiment, cutlines CL1, CL2, and CL3 are set in portions on the image plane of the projection optical system, which correspond to the central portions of three line patterns, respectively, among five line patterns which form the first pattern portion PT1 (see FIG. 2). Similarly, cutlines CL4, CL5, and CL6 are set in portions on the image plane of the projection optical system, which correspond to the central portions of three line patterns, respectively, among five line patterns which form the second pattern portion PT2 (see FIG. 2). Note that in this embodiment, attention is focused on the widthwise dimension of each line pattern, so a cutline is set in the widthwise direction of this line pattern. In contrast, when attention is focused on the longitudinal dimension of each line pattern, a cutline need only be set in the longitudinal direction of this line pattern. Also, when attention is focused on the distance between adjacent line patterns, a cutline need only be set so as to run across these adjacent line patterns. Note that FIG. 2 shows setting of cutlines for the mask pattern assuming that the dimension on the object plane of the projection optical system and that on the image plane of the projection optical system are equal to each other (that is, the projection optical system has unit magnification) for the sake of descriptive simplicity. However, in practice, cutlines must be set on the image plane of the projection optical system in consideration of a mask pattern having a dimension corresponding to that on the image plane, based on the magnification of the projection optical system.

Optical images formed on the cutlines CL1 and CL4 set for the central line patterns generate no pattern shifts unless a bilaterally asymmetric aberration or a bilaterally asymmetric effective light source is produced. Therefore, the position of the optical image corresponding to each central line pattern coincides with that of this central line pattern. On the other hand, optical images formed on the cutlines CL3 and CL6 set for the endmost line patterns generate pattern shifts due to an optical proximity effect even if a bilaterally symmetric aberration and a bilaterally symmetric effective light source are produced. Therefore, an optical image corresponding to each endmost line pattern is formed at a position shifted horizontally with respect to that of this endmost line pattern, so the position of the optical image corresponding to each endmost line pattern does not always coincide with that of this endmost line pattern.

In step S106, target values for the dimensions of the optical images of the mask pattern, which are formed on the cutlines set in step S104, are set. In this embodiment, target values for the widthwise dimensions (line widths) of optical images of the mask pattern, which are formed on the cutlines CL1 to CL6, respectively, are set, as shown in Table 1. Again in this embodiment, an effective light source is determined such that the line widths, along the cutlines CL1 to CL6, of optical images of the mask pattern, which are formed on the cutlines CL1 to CL6, respectively, come close to their target values shown in Table 1.

TABLE 1

|  | Cutline | | | | | |
| --- | --- | --- | --- | --- | --- | --- |
|  | CL1 | CL2 | CL3 | CL4 | CL5 | CL6 |
| Target Value [nm] | 75 | 75 | 75 | 50 | 50 | 50 |

In step S108, a plurality of different element light sources to be formed on the pupil plane of the illumination optical system are generated. In this embodiment, the pupil plane of the illumination optical system is divided into a plurality of regions R1 to R177 in a grid pattern, and only one of these plurality of regions R1 to R177 is illuminated to generate it as an element light source, as shown in FIG. 3. Note that in FIG. 3, a circle indicated by a dotted line represents a circle with a coherence factor of 1.

Figure 4A:
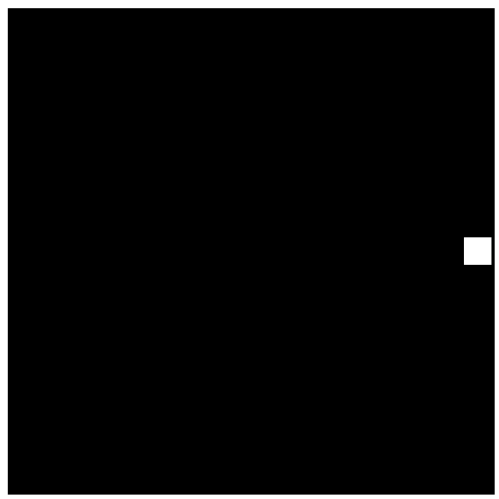
FIGS. 4A and 4B are views for explaining the element light sources generated in step S108 of the flowchart shown in FIG. 1.
Figure 4B:
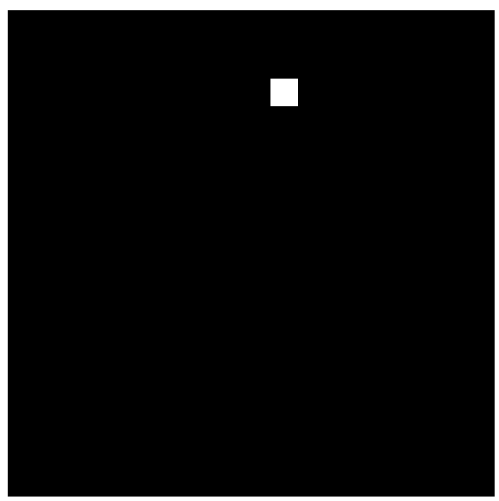

FIGS. 4A and 4B illustrate examples of the plurality of element light sources generated in step S108. FIG. 4A shows an element light source obtained by illuminating only the region R96, and FIG. 4B shows an element light source obtained by illuminating only the region R21. As described above, in this embodiment, only one of the plurality of regions R1 to R177 is illuminated to generate it as an element light source, so 177 element light sources are generated. The linear sum (light sources obtained by combining the plurality of element light sources) of the plurality of element light sources generated in step S108 is finally determined as an effective light source.

Although the pupil plane of the illumination optical system is divided in a grid pattern in this embodiment, it may be divided in another shape such as an arcuated shape. Also, although each divided region is illuminated one by one to generate it as one element light source in this embodiment, a set of a plurality of regions may be illuminated at once to generate them as one element light source.

In step S110, optical images (their intensity distributions) of the mask pattern, which are formed on the cutlines set in step S104 upon illuminating the mask pattern with each of the plurality of element light sources generated in step S108, are calculated for each of the plurality of element light sources. Note that the intensity of an optical image (aerial image) means the amount of light which reaches one arbitrary point on the substrate under a certain exposure condition. The intensity distribution of an optical image can be calculated using, for example, an optical simulator.

Figure 5:
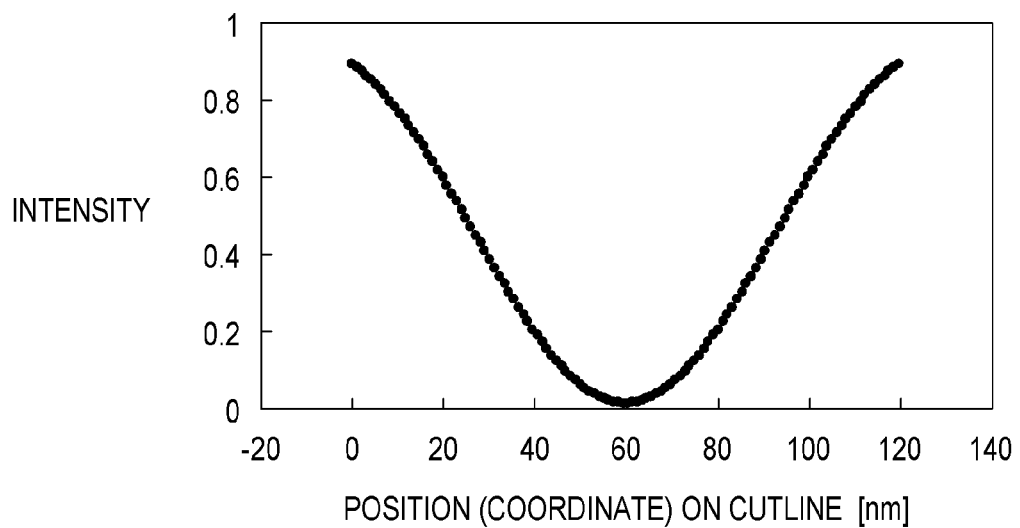
FIG. 5 is a graph for explaining the intensity distribution of an optical image calculated in step S110 of the flowchart shown in FIG. 1.
Figure 6:
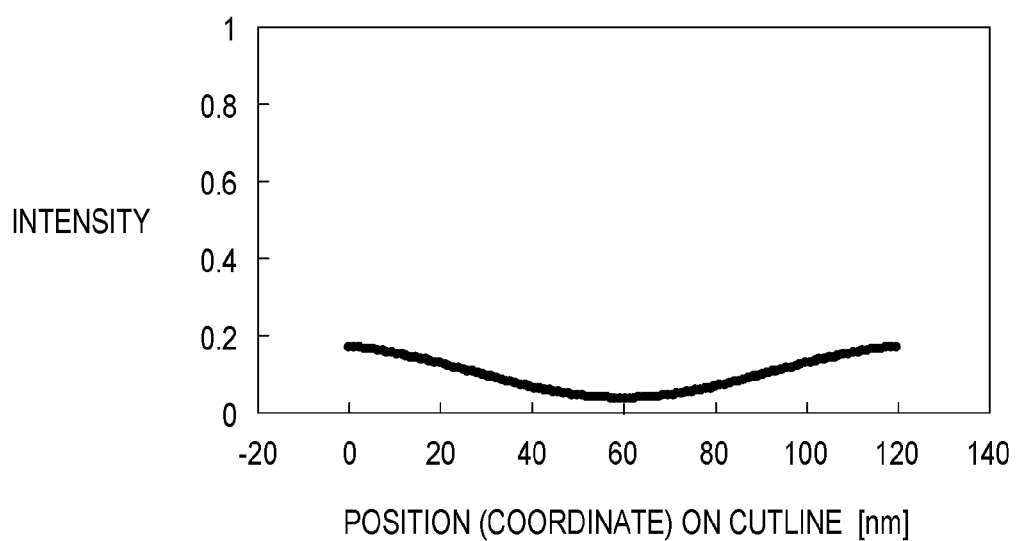
FIG. 6 is a graph for explaining the intensity distribution of an optical image calculated in step S110 of the flowchart shown in FIG. 1.

FIG. 5 is a graph showing the intensity distribution of an optical image formed on the cutline CL1 upon illuminating the mask pattern shown in FIG. 2 with the element light source shown in FIG. 4A. Also, FIG. 6 is a graph showing the intensity distribution of an optical image formed on the cutline CL1 upon illuminating the mask pattern shown in FIG. 2 with the element light source shown in FIG. 4B. FIGS. 5 and 6 show the position (coordinate) on the cutline on the abscissa, and the intensity of the optical image at each position on the cutline on the ordinate. The intensity distribution of one optical image is formed from a finite number (241) of light intensity data, and includes light intensity data at positions on the cutline, which shift from each other in steps of (at an interval of) 0.5 nm, as shown in FIGS. 5 and 6. In this case, each position on the cutline, at which light intensity data is present, will be referred to as a grid hereinafter, and let Δx be the interval between adjacent positions on the cutline, at which light intensity data are present. As the interval Δx reduces, the accuracy of calculation of an optical image (its intensity distribution) by an optical simulator improves, but the number of data undesirably increases. Therefore, the interval Δx is about 0.5 nm to 1 nm.

In this embodiment, the intensity distribution of an optical image formed on each of the six cutlines CL1 to CL6 set in step S104 is calculated for each of the 177 element light sources generated in step S108, that is, the intensity distributions of 1,062 optical images are calculated. Note that the intensity distribution of the optical image may take any form as long as it is linear with respect to the intensity of the element light source. For example, to obtain an image corresponding to a resist image, the optical image (its intensity distribution) is often convolved with a Gaussian function describing diffusion of an acid in a resist, such an image is linear with respect to the intensity of the element light source, and is therefore included in the optical image in this embodiment.

In step S112, an effective light source is determined based on the optical images (their intensity distributions) calculated in step S110. More specifically, a weight (light emission intensity) to be applied to each of the plurality of element light sources is determined such that the dimensions, on the cutlines, of the optical images of the mask pattern come close to their target values, thereby determining, as an effective light source, light sources obtained by combining the plurality of element light sources applied with the weights. In other words, the ratio between the light emission intensities of the plurality of element light sources (the 177 element light sources in this embodiment) generated in step S108 is determined to determine an effective light source.

Figure 7:
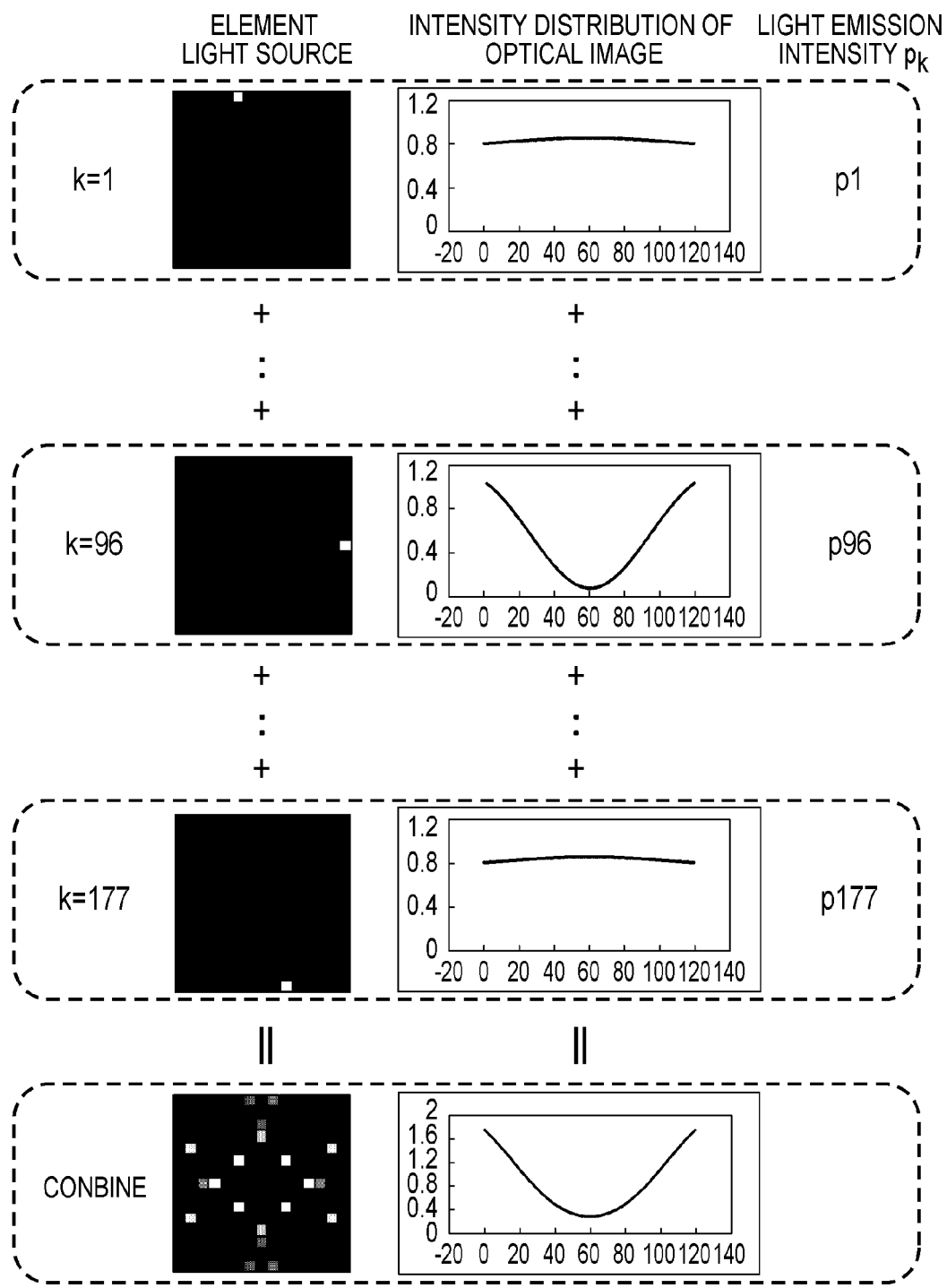
FIG. 7 is a view for explaining determination of an effective light source in step S112 of the flowchart shown in FIG. 1.

An overview of determination of an effective light source (S112) in this embodiment will be described with reference to FIG. 7. FIG. 7 is a view showing the relationship among the element light sources generated in step S108, the intensity distributions of the optical images calculated in step S110, and the light emission intensities $p_k$ (k=1 to 177) of the element light sources determined in step S112.

In the cutline of interest, an intensity distribution obtained by weighting and combining the intensity distributions of the optical images corresponding to the 177 element light sources, respectively, is determined as the intensity distribution of an optical image for an effective light source to be determined finally. Weights (light emission intensities) to be applied to the 177 element light sources are determined such that the intensity distribution obtained by weighting and combining the intensity distributions of the optical images come close to the target values of the line widths of the optical images set in step S106. In other words, changing the weight to be applied to each of the plurality of element light sources makes it possible to change the intensity distribution of an optical image corresponding to a final effective light source. Such a technique is based on the Abbe's formula, which is known to those skilled in the art. The Abbe's formula is used as well in the techniques described in, for example, Japanese Patent No. 4378266 and Japanese Patent Laid-Open No. 2002-261004.

As described above, the intensity of an optical image corresponding to the position of interest upon illuminating the mask pattern with a given effective light source is calculated by applying the weights (light emission intensities) of a plurality of element light sources to the intensity values of optical images corresponding to these element light sources, respectively, and combining these element light sources. It can easily be determined based on such a linear law whether a given position in an optical image formed using a given effective light source is a light point or a dark point. In, for example, Japanese Patent No. 4378266 and Japanese Patent Laid-Open No. 2002-261004, the light/dark state of the optical image is defined for each of a plurality of positions to optimize the effective light source because a linear law easily holds true for the intensity of the optical image with respect to the position.

On the other hand, the dimension of the optical image is a physical quantity that is highly nonlinear with respect to the effective light source. In an optical image of a pattern which generates a pattern shift, the dimension of the optical image and the light/dark state of the optical image at each position have no one-to-one correspondence between them. Therefore, it is very difficult to apply the prior arts which use linear programming to such a nonlinear problem.

Hence, in this embodiment, the above-mentioned nonlinear problem is formulated using mixed integer programming as presented in:

Expression Group 1

Minimization: $t$     (1)

Constraints:

$$\sum_{k=1}^{m} l_{ijk} p_k > u_{ij} \ \forall \ i, \forall \ j \quad (2)$$

$$\sum_{k=1}^{m} l_{ijk} p_k < (1 - u_{ij}) + M u_{ij} \ \forall \ i, \forall \ j \quad (3)$$

$$\left| \sum_{i=1}^{L_j} (1 - u_{ij}) - W_j \right| \leq t \ \forall \ j \quad (4)$$

$$u_{ij} \geq u_{(i+1)j} \ i \in \left\{ i \ \middle| \ 1 \leq i \leq \frac{L_j - 1}{2} \right\}, \forall \ j \quad (5)$$

$$u_{ij} \leq u_{(i+1)j} \ i \in \left\{ i \ \middle| \ \frac{L_j + 1}{2} \leq i \leq L_j - 1 \right\}, \forall \ j \quad (6)$$

$$p_k \geq 0 \ k = 1, \ldots, m \quad (7)$$

$$t \geq 0 \quad (8)$$

$$u_{ij} \in \{0, 1\} \ \forall \ i, \forall \ j \quad (9)$$

Definition of Constants:

$$W_j = \text{Int}\left( \frac{\text{Width}_j}{\Delta x} + 0.5 \right) \ \forall \ j \quad (10)$$

$$L_j = \text{Max}(i) \ \forall \ j \quad (11)$$

$$m = \text{Max}(k) \quad (12)$$

where $p_k$ (k=1, 2, . . . , m) is a decision variable, u and t are dummy variables for control, and l, W, L, m, M, Width, and Δx are constants. The variable $p_k$ representing the light emission intensity (weight) of each element light source is to be obtained finally.

With this process, an effective light source optimization problem which directly evaluates the dimension (line width) of the optical image can be solved using mathematical programming.

The greatest feature of expression group 1 lies in that the value u as presented in expression (9) is introduced. The value u is a variable which takes a first integer value if the intensity of the optical image exceeds a threshold, and takes a second integer value if the intensity of the optical image does not exceed the threshold, and is a binary variable which takes 0 or 1 in this embodiment. Therefore, the problem defined by expression group 1 is a mixed integer programming problem (MIP problem). The mixed integer programming problem can easily be solved using a commercially available solver such as CPLEX developed by ILOG, Inc. More specifically, inputting, into the solver, expression (1) as an objective function for minimization, and expressions (2) to (9) as constraints and boundary conditions, makes it possible to obtain a solution which minimizes the variable t presented in expression (1), among combinations of the variables which simultaneously satisfy the conditions presented in expressions (2) to (9).

The meaning of each expression in expression group 1 will be explained. Expressions (2) and (3) are associated with the intensity of the optical image. $I_{ijk}$ in each of the left-hand sides of expressions (2) and (3) is the intensity of the optical image calculated in step S110, and means the intensity value, at the i-th position, of an optical image formed on the j-th cutline upon illuminating the k-th element light source at a unit amount of light. In this embodiment, six cutlines are present, so j takes values from 1 to 6. i is a number which starts from 1 and is sequentially assigned to each grid position in the intensity distribution of the optical image formed on the cutline. In this embodiment, the intensity of the optical image is obtained at an interval of 0.5 nm ($\Delta x$), so i takes values from 1 to 241 for a cutline having a length of 120 nm. $L_j$ is the maximum value of i (see expression (11)). k is a number (element light source number) assigned to each element light source. In this embodiment, 177 element light sources are generated, so k takes values from 1 to 177. m is the maximum value of k, that is, the total number of element light sources (see expression (12)).

As can be seen from the foregoing description, the value obtained by combining the light intensities, at the i-th positions, of optical images formed on the j-th cutlines upon illuminating the k-th (k=1, 2, . . . , 177) element light sources at the light emission intensities $p_k$ is $\Sigma I_{ijk} p_k$. Note that the light emission intensity $p_k$ has a nonnegative real number (see expression (7)).

The intensity value of the optical image, which serves as a threshold for determination as to whether the resist can be developed upon developing the substrate, is called a slice level. Assuming that the slice level is "1", a positive resist satisfies:

Condition (A): if $\Sigma I_{ijk} p_k > 1$, the resist dissolves upon development, Condition (B): if $\Sigma I_{ijk} p_k < 1$, the resist remains behind upon development.

Although a case in which the resist used is a positive resist will be taken as an example in this embodiment, the resist used may be a negative resist, as a matter of course. Note that when the resist used is a negative resist, it remains behind upon development if $\Sigma I_{ijk} p_k > 1$, and it dissolves upon development if $\Sigma I_{ijk} p_k < 1$.

The relationship between expressions (2) and (3) and the variable $u_{ij}$ defined by expression (9) will be described. For example, if $\Sigma I_{ijk} p_k < 1$, the condition presented in expression (2) cannot be satisfied when the variable $u_{ij}$ takes 1. On the other hand, if $\Sigma I_{ijk} p_k > 1$, the condition presented in expression (2) can be satisfied regardless of whether the variable $u_{ij}$ takes 0 or 1.

M in expression (3) symbolizes a "large value" and naturally takes a large value (for example, 10 or 20) which is not the normal intensity value of the optical image. In this embodiment, M is 50. Hence, if $\Sigma I_{ijk} p_k > 1$, the condition presented in expression (3) cannot be satisfied when the variable $u_1$ takes 0; or if $\Sigma I_{ijk} p_k < 1$, the condition presented in expression (3) can be satisfied regardless of the value of the variable $u_{ij}$. Therefore, $\Sigma I_{ijk} p_k$ and $u_{ij}$ have a relation:

$$u_{ij} = \begin{cases} 1 & \text{if} \left( \sum_{k=1}^{m} I_{ijk} p_k > 1 \right) \\ 0 & \text{if} \left( \sum_{k=1}^{m} I_{ijk} p_k < 1 \right) \end{cases} \quad (13)$$

Figure 8:
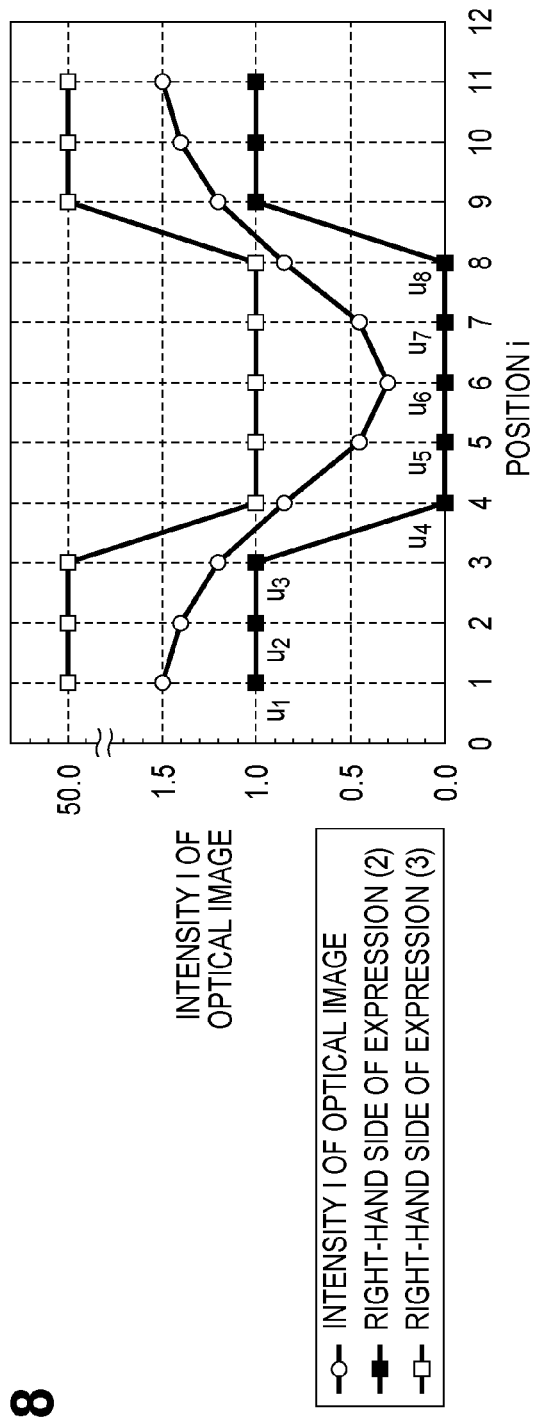
FIG. 8 is a graph for explaining the determination of an effective light source in step S112 of the flowchart shown in FIG. 1.

FIG. 8 is a graph schematically showing the relation presented in expression (13). As can be seen from FIG. 8, the range of intensities of the optical image is kept narrow by expressions (2) and (3). The intensity of the optical image has a value larger than 1 for a position at which the variable $u_{ij}$ takes "1", and it has a value smaller than 1 for a position at which the variable $u_{ij}$ takes "0". In this manner, information as to whether the resist can dissolve directly corresponds to the value of the variable $u_{ij}$.

Expressions (4) and (10) are associated with the line width of the optical image of the mask pattern. In this embodiment, the length of a continuous dark portion in the optical image is equal to the line width of the optical image, so the line width Width at this time can be approximated by:

$$\text{Width} \approx \sum_{i=1}^{L_j} (1 - u_{ij}) \cdot \Delta x \quad (14)$$

On the other hand, using the integer $W_j$ presented in expression (10), the target value $\text{Width}_j$ of the line width of an optical image formed on the j-th cutline can be approximated by:

$$\text{Width}_j \approx W_j \cdot \Delta x \quad (15)$$

Note that the Int function included in expression (10) is a function which means that the fractional part of a given number is dropped, and Int(A+0.5) for the nonnegative real number A is equivalent to rounding of the nonnegative real number A. Therefore, from expressions (14) and (15), the difference between the target value of the line width of the optical image and the line width of the optical image in the optimization result is proportional to:

$$\sum_{i=1}^{L_j} (1 - u_{ij}) - W_j \quad (16)$$

As the solution of expression (16) comes closer to zero, the difference between the target value of the line width of the optical image and the line width of the optical image in the optimization result reduces. Expression (4) is a constraint which limits the absolute value of the solution presented in expression (16) to the variable t or less. Therefore, minimization (see expression (1)) of the nonnegative variable t (see expression (8)) is a problem to be solved using mathematical programming.

Figure 9:
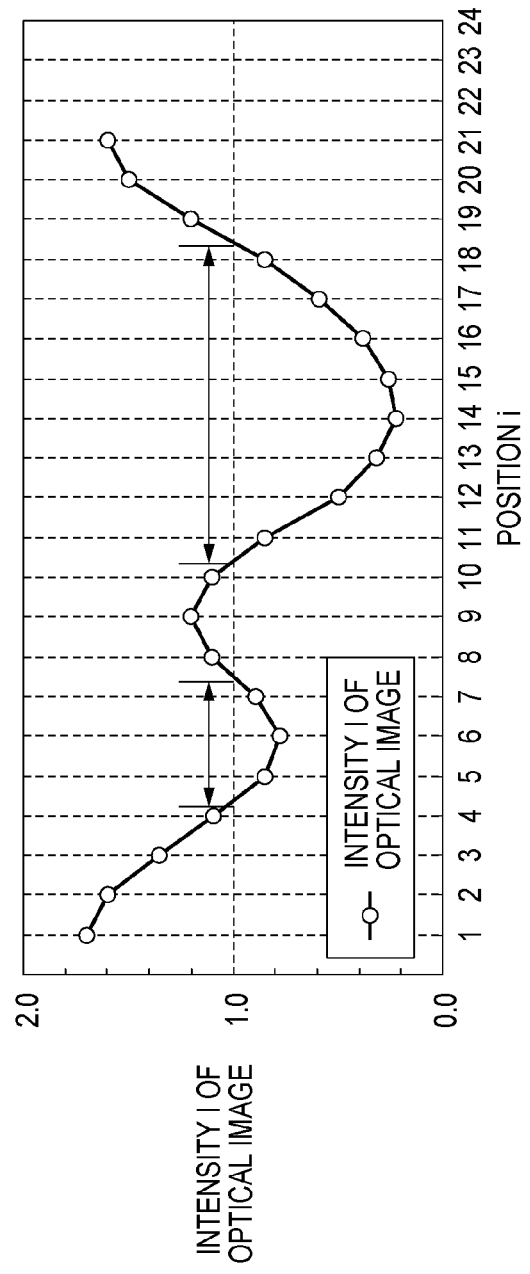
FIG. 9 is a graph for explaining the determination of an effective light source in step S112 of the flowchart shown in FIG. 1.
Figure 10:
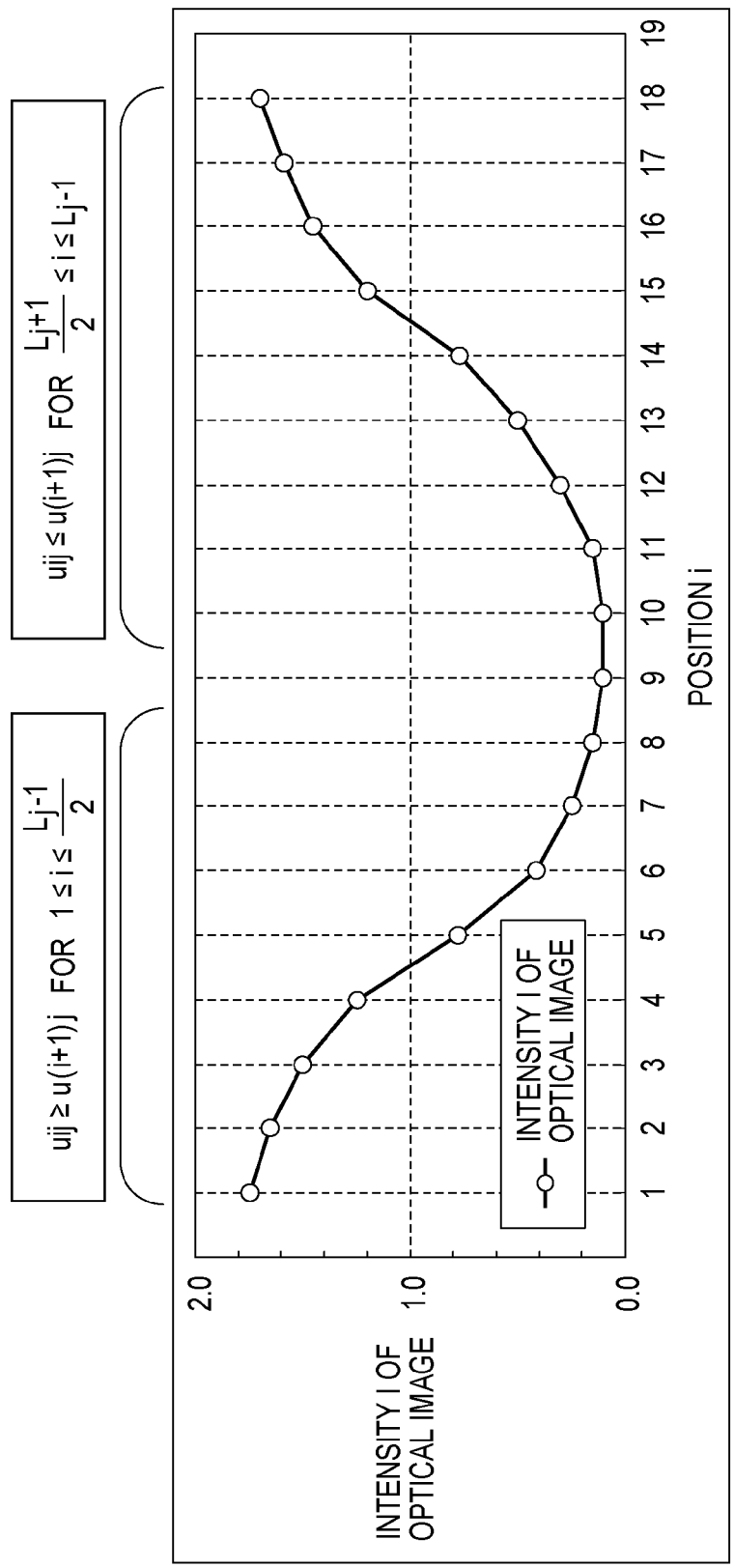
FIG. 10 is a graph for explaining the determination of an effective light source in step S112 of the flowchart shown in FIG. 1.

Expressions (5) and (6) serving as constraints will be described. To allow the line width of the optical image of the mask pattern to have a correct physical meaning, a portion in which the resist remains behind always needs to be continuous. When, for example, the intensity value of the intensity distribution of the optical image of the mask pattern falls below the slice level in two separated portions, as shown in FIG. 9, this optical image intensity distribution is undesirable. For this reason, in this embodiment, expressions (5) and (6), as shown in FIG. 10, are defined as constraints to prevent such an optical image intensity distribution from being derived as an optimization result. FIG. 10 is a graph schematically showing the meaning of expressions (5) and (6).

In this manner, an effective light source optimization problem which directly evaluates the line width of the optical image of the mask pattern can be replaced with a mixed integer programming problem which brings the sum of the binary variables $u_{ij}$ close to a target value. In this embodiment, only the line width of the optical image is assumed as a target (evaluation target), so the position of the optical image is not practically fixed. Therefore, even if a pattern shift occurs, a solution (effective light source) can be obtained assuming the line width of the optical image as a target.

In this embodiment, an optimization result (the light emission intensities $p_k$ of the 177 element light sources) shown in Table 2 was obtained for the target values of the line widths of the optical images of the mask pattern shown in Table 1. The plurality of element light sources generated in step S108 are weighted with the light emission intensities $p_k$ shown in Table 2, and are combined, thereby obtaining an effective light source, as shown in FIG. 11.

TABLE 2

| Element Light Source Number k | Light Emission Intensity $p_k$ |
|---|---|
| 1 | 0 |
| 2 | 0 |
| 3 | 0 |
| 4 | 0 |
| 5 | 0 |
| 6 | 0 |
| 7 | 0.0278089 |
| 8 | 0.1364546 |
| 9 | 0 |
| 10 | 0.0643602 |
| 11 | 0 |
| 12 | 0.1364546 |
| 13 | 0.0278089 |
| 14 | 0 |
| 15 | 0 |
| 16 | 0 |
| 17 | 0 |
| 18 | 0 |
| 19 | 0 |
| 20 | 0 |
| 21 | 0 |
| 22 | 0 |
| 23 | 0 |
| 24 | 0 |
| 25 | 0 |
| 26 | 0.0710562 |
| 27 | 0.0024957 |
| 28 | 0 |
| 29 | 0 |
| 30 | 0 |
| 31 | 0 |
| 32 | 0 |
| 33 | 0 |
| 34 | 0 |
| 35 | 0 |
| 36 | 0 |
| 37 | 0.0024957 |
| 38 | 0.0710562 |
| 39 | 0.0776008 |
| 40 | 0 |
| 41 | 0 |
| 42 | 0 |
| 43 | 0.0503098 |
| 44 | 0.0766415 |
| 45 | 0 |
| 46 | 0.0766415 |
| 47 | 0.0503098 |
| 48 | 0 |
| 49 | 0 |
| 50 | 0 |
| 51 | 0.0776008 |
| 52 | 0 |
| 53 | 0 |
| 54 | 0 |
| 55 | 0 |
| 56 | 0 |
| 57 | 0 |
| 58 | 0 |
| 59 | 0.1009104 |
| 60 | 0 |
| 61 | 0 |
| 62 | 0 |
| 63 | 0 |
| 64 | 0 |
| 65 | 0 |
| 66 | 0 |
| 67 | 0 |
| 68 | 0 |
| 69 | 0 |
| 70 | 0 |
| 71 | 0 |
| 72 | 0 |
| 73 | 0 |
| 74 | 0 |
| 75 | 0 |
| 76 | 0 |
| 77 | 0 |
| 78 | 0 |
| 79 | 0 |
| 80 | 0 |
| 81 | 0 |
| 82 | 0 |
| 83 | 0 |
| 84 | 0 |
| 85 | 0 |
| 86 | 0 |
| 87 | 0 |
| 88 | 0 |
| 89 | 0 |
| 90 | 0 |
| 91 | 0 |
| 92 | 0 |
| 93 | 0 |
| 94 | 0 |
| 95 | 0 |
| 96 | 0 |
| 97 | 0 |
| 98 | 0 |
| 99 | 0 |
| 100 | 0 |
| 101 | 0 |
| 102 | 0 |
| 103 | 0 |
| 104 | 0 |
| 105 | 0 |
| 106 | 0 |

TABLE 2-continued

| Element Light Source Number k | Light Emission Intensity $p_k$ |
|---|---|
| 107 | 0 |
| 108 | 0 |
| 109 | 0 |
| 110 | 0 |
| 111 | 0 |
| 112 | 0 |
| 113 | 0 |
| 114 | 0 |
| 115 | 0 |
| 116 | 0 |
| 117 | 0 |
| 118 | 0 |
| 119 | 0.1009104 |
| 120 | 0 |
| 121 | 0 |
| 122 | 0 |
| 123 | 0 |
| 124 | 0 |
| 125 | 0 |
| 126 | 0 |
| 127 | 0.0776008 |
| 128 | 0 |
| 129 | 0 |
| 130 | 0 |
| 131 | 0.0503098 |
| 132 | 0.0766415 |
| 133 | 0 |
| 134 | 0.0766415 |
| 135 | 0.0503098 |
| 136 | 0 |
| 137 | 0 |
| 138 | 0 |
| 139 | 0.0776008 |
| 140 | 0.0710562 |
| 141 | 0.0024957 |
| 142 | 0 |
| 143 | 0 |
| 144 | 0 |
| 145 | 0 |
| 146 | 0 |
| 147 | 0 |
| 148 | 0 |
| 149 | 0 |
| 150 | 0 |
| 151 | 0.0024957 |
| 152 | 0.0710562 |
| 153 | 0 |
| 154 | 0 |
| 155 | 0 |
| 156 | 0 |
| 157 | 0 |
| 158 | 0 |
| 159 | 0 |
| 160 | 0 |
| 161 | 0 |
| 162 | 0 |
| 163 | 0 |
| 164 | 0 |
| 165 | 0.0278089 |
| 166 | 0.1364546 |
| 167 | 0 |
| 168 | 0.0643602 |
| 169 | 0 |
| 170 | 0.1364546 |
| 171 | 0.0278089 |
| 172 | 0 |
| 173 | 0 |
| 174 | 0 |
| 175 | 0 |
| 176 | 0 |
| 177 | 0 |

FIG. 12 is a view showing an optical image formed on the image plane of the projection optical system upon illuminating the mask pattern shown in FIG. 2 with the effective light source shown in FIG. 11. In FIG. 12, reference symbol PT denotes a pattern group of the mask pattern; and IM, an optical image (the boundary line of a portion in which the resist remains behind). Table 3 shows the line widths of optical images of the mask pattern, which are formed on the cutlines CL1 to CL6, respectively, at this time. As can be seen from FIG. 12 and Table 3, the line widths of optical images of the mask pattern, which are formed on the cutlines CL1 to CL6, respectively, are close to their target values, despite the occurrence of pattern shifts.

TABLE 3

| | Cutline | | | | | |
|---|---|---|---|---|---|---|
| | CL1 | CL2 | CL3 | CL4 | CL5 | CL6 |
| Line Width [nm] | 75.06 | 75.16 | 75.18 | 49.82 | 50.72 | 49.71 |

Note that this embodiment takes the symmetry of the effective light source into consideration. The symmetry of the effective light source can be estimated from that of the mask pattern, and is set such that an effective light source obtained as a final solution exhibits four-fold symmetry (vertical/horizontal symmetry). More specifically, $$p_1 = p_5 = p_{173} = p_{177} \tag{17}$$

$$p_{39} = p_{51} = p_{127} = p_{139} \tag{18}$$

$$p_{85} = p_{93} \tag{19}$$

need only be added to expression group 1 as new constraints.

Expressions (17) to (19) are some of relations which constrain the symmetry of the effective light source in this embodiment, and similar relations are set for all the light emission intensities $p_k$ (k=1 to 177). In this manner, taking the symmetry between the element light sources into consideration makes it possible to practically decrease the number of independent variables, thus shortening the computation time. Note that the relations between the element light sources are not limited to these specific ones, and other relations may be set.

<Second Embodiment>

In the first embodiment, all cutlines are assumed as cutlines of interest to be used to form optical images (portions in which the resist remains behind) of line patterns. However, in practice, attention is often focused on optical images (portions in which the resist dissolves) of space patterns. In the latter case, some expressions included in expression group 1 need only be replaced in the following way.

When attention is focused on space patterns, the definition of the value of the variable $u_{ij}$ in expression (13) need only be reversed, so expressions (2) and (3) included in expression group 1 need only be respectively replaced with:

$$\sum_{k=1}^{m} I_{ijk} p_k > 1 - u_{ij} \; \forall i, \forall j \tag{20}$$

$$\sum_{k=1}^{m} I_{ijk} p_k < u_{ij} + M \cdot (1 - u_{ij}) \; \forall i, \forall j \tag{21}$$

According to expressions (20) and (21), the variable $u_{ij}$ has a meaning as presented in:

$$u_{ij} = \begin{cases} 0 & \text{if} \left(\sum_{k=1}^{m} I_{ijk} p_k > 1\right) \\ 1 & \text{if} \left(\sum_{k=1}^{m} I_{ijk} p_k < 1\right) \end{cases} \quad (22)$$

Therefore, the effective light source can be optimized in consideration of the line widths of space patterns (light portions), as in the first embodiment.

The effective light source can be optimized even if a cutline used to evaluate the line width of a light portion in an optical image, and a cutline used to evaluate the line width of a dark portion in the optical image mix with each other. In this case, expressions (20) and (21) need only be provided as the definition of the variable $u_{ij}$ for a cutline used to evaluate the line width of a light portion in an optical image, and expressions (2) and (3) need only be provided as the definition of the variable $u_{ij}$ for a cutline used to evaluate the line width of a dark portion in the optical image.

<Third Embodiment>

In expression group 1 presented in the first embodiment, expression (4) is limited by the same variable t for all numbers j. In other words, the variable t is the maximum value of the left-hand side of expression (4), and expression group 1 serves as a problem for minimizing the variable t, thus presenting a problem for "maximum value minimization".

In this embodiment, a mixed integer programming problem is solved upon replacing expression (1) serving as an objective function in expression group 1 with:

$$\text{Minimization: } \Sigma C_j \cdot t_j \quad (23)$$

and replacing expression (4) serving as one of constraints in expression group 1 with:

$$\left| \sum_{i=1}^{L_j} (1 - u_{ij}) - W_j \right| \le t_j \; \forall \; j \quad (24)$$

This problem has a variable t defined for each number j, and minimizes the linear sum of the variables t.

$C_j$ in expression (23) is a numerical value of 0 or more given by the user in advance. When, for example, 1 is substituted for $C_1$, 1 is substituted for $C_2$, 1 is substituted for $C_3$, 1 is substituted for $C_4$, 1 is substituted for $Cy_5$, and 5 is substituted for $C_6$, expression (23) is $t_1+t_2+t_3+t_4+t_5+5\times t_6$. Thus, the value of the variable $t_6$ has a greatest influence on $\Sigma C_j \cdot t_j$, so a solution in which the value of the variable $t_6$ is smallest of the values of the variables $t_1$ to $t_5$ can be obtained. In this manner, arbitrarily setting the numerical value $C_j$ makes it possible to obtain an effective light source in which a line width closer to a critical line width has a smaller difference from its target value.

<Fourth Embodiment>

In the first embodiment, target values for the line widths of optical images formed on the cutlines are set, and an effective light source is obtained such that the line widths of actually formed optical images come close to their target values. In the fourth embodiment, not only the line widths of optical images formed on the cutlines are brought close to their target values, but also the ranges of line widths of these optical images are limited.

More specifically, in this embodiment, a target value Width$_j$, a maximum line width target value Width$_{Max,j}$, and a minimum line width target value Width$_{Min,j}$ are set for each cutline. At this time, $$W_{Min,j} \le \sum_{i=1}^{L_j} (1 - u_{ij}) \le W_{Max,j} \quad (25)$$

is added to expression group 1 as a new constraint, where $W_{Min,j}$ and $W_{Max,j}$ are constants which are respectively defined by:

$$W_{Min,j} = \text{Int}\left(\frac{Width_{Min,j}}{\Delta x} + 0.5\right) \; \forall \; j$$

$$W_{Max,j} = \text{Int}\left(\frac{Width_{Max,j}}{\Delta x} + 0.5\right) \; \forall \; j$$

With this process, while aiming to bring the line widths of optical images formed on the cutlines close to the target values Width, the line widths of these optical images can be limited to fall within the set ranges of line widths. According to this embodiment, the line width accuracy can be changed for each cutline.

<Fifth Embodiment>

In the actual fabrication of a semiconductor device, the amount of defocus at the time of exposure must also be taken into consideration. In general, an effective light source which does not change the line widths of optical images of the mask pattern even if defocus from the image plane of the projection optical system occurs is preferable.

Although the effective light source is optimized for one focus plane in the first to fourth embodiments, it can also be optimized for a plurality of defocus planes defocused from the image plane of the projection optical system.

More specifically, a plurality of defocus planes are set, and optical images of the mask pattern, which are formed at positions corresponding to the cutlines, are calculated for each of the plurality of defocus planes in step S110. Setting target values for the line widths of these optical images, respectively, makes it possible to optimize the effective light source while taking defocus into consideration.

Cutlines (their corresponding positions) which have the same characteristics but are set on the plurality of different defocus planes, respectively, can be regarded as different cutlines. In this embodiment, cutlines obtained by defocusing cutlines CL1 to CL6 by +25 nm are regarded as cutlines CL7 to CL12, respectively. Again in this embodiment, cutlines obtained by defocusing the cutlines CL1 to CL6 by +50 nm are regarded as cutlines CL13 to CL18, respectively.

FIG. 13 shows an effective light source obtained upon setting target values, as shown in Table 4, for optical images formed on the cutlines CL1 to CL18, respectively. Table 5 shows the line widths of optical images of the mask pattern, which are formed on the cutlines CL1 to CL18, respectively, at this time.

TABLE 4

|  |  | Cutline | | | | | |
| --- | --- | --- | --- | --- | --- | --- | --- |
|  | Defocus | CL1 | CL2 | CL3 | CL4 | CL5 | CL6 |
| Target Value [nm] | 0 nm | 75 | 75 | 75 | 50 | 50 | 50 |
|  | 25 nm | 75 | 75 | 75 | 50 | 50 | 50 |
|  | 50 nm | 75 | 75 | 75 | 50 | 50 | 50 |

TABLE 5

| | Defocus | Cutline | | | | | |
| --- | --- | --- | --- | --- | --- | --- | --- |
| | | CL1 | CL2 | CL3 | CL4 | CL5 | CL6 |
| Line Width [nm] | 0 nm | 74.4 | 75.81 | 76.83 | 48.88 | 50.66 | 52 |
| | 25 nm | 74.27 | 75.98 | 75.93 | 49.01 | 50.97 | 51.15 |
| | 50 nm | 73.84 | 76.56 | 72.8 | 49.54 | 52 | 47.84 |

According to this embodiment, the effective light source can be optimized in consideration of defocus. In this embodiment, only optical images obtained upon defocus in the positive direction are taken into consideration. However, optical images obtained upon defocus in the negative direction may be taken into consideration, or both optical images obtained upon defocus in the positive direction and those obtained upon defocus in the negative direction may be taken into consideration.

<Sixth Embodiment>

In the actual fabrication of a semiconductor device, the amount of exposure (dose) at the time of exposure must also be taken into consideration. In general, an effective light source which does not change the line widths of optical images of the mask pattern even if a dose different from an ideal dose is used.

The dose means the total amount of exposure. Therefore, in the first to fifth embodiments, when a light emission intensity $p_k$ (k=1 to 177) is obtained as a solution, the dose is $\Sigma p_k$. This dose is defined as a reference dose. For example, an increase in dose by a factor of 1.1 is equivalent to an increase in value of all the light emission intensities $p_k$ by a factor of 1.1.

The effective light source can be optimized for a plurality of doses in the same way as in the fifth embodiment. In the sixth embodiment, three doses: a reference dose, a 1.1-times dose, and a 0.9-times dose are set (that is, the values of the light emission intensities $p_k$ are proportionally multiplied by given factors to generate proportional-multiplication element light sources). Target values for the line widths of optical images formed on cutlines CL1 to CL6, respectively, are set for each dose. In this case, the cutlines CL1 to CL6 corresponding to a 1.1-times dose are regarded as cutlines CL7 to CL12, respectively, and those corresponding to a 0.9-times dose are regarded as cutlines CL13 to CL18, respectively. Expressions (2) and (3) included in expression group 1 need only be replaced with:

$$\sum_{k=1}^{m} I_{ijk} p_k > u_{ij} \; \forall \, i, j \in \{j \mid 1 \le j \le 6\} \quad (26)$$

$$\sum_{k=1}^{m} I_{ijk} p_k < (1 - u_{ij}) + M u_{ij} \; \forall \, i, j \in \{j \mid 1 \le j \le 6\} \quad (27)$$

$$1.1 \cdot \sum_{k=1}^{m} I_{ijk} p_k > u_{ij} \; \forall \, i, j \in \{j \mid 7 \le j \le 12\} \quad (28)$$

$$1.1 \cdot \sum_{k=1}^{m} I_{ijk} p_k < (1 - u_{ij}) + M u_{ij} \; \forall \, i, j \in \{j \mid 7 \le j \le 12\} \quad (29)$$

$$0.9 \cdot \sum_{k=1}^{m} I_{ijk} p_k > u_{ij} \; \forall \, i, j \in \{j \mid 13 \le j \le 18\} \quad (30)$$

$$0.9 \cdot \sum_{k=1}^{m} I_{ijk} p_k < (1 - u_{ij}) + M u_{ij} \; \forall \, i, j \in \{j \mid 13 \le j \le 18\} \quad (31)$$

$$I_{ijk} = I_{i(j+6)k} = I_{i(j+12)k} \; \forall \, i, \forall \, k, j \in \{j \mid 1 \le j \le 6\} \quad (32)$$

Expression (32) describing that the optical image formed on the same cutline remains the same even when the dose changes is further added to the features of the fifth embodiment.

Note that the dose value is not limited to a 1.1-times dose and a 0.9-times dose, and a 1.2-times dose and a 0.8-times dose, for example, may be used. The number of doses is not limited to three, either, and four or five doses may be used.

<Seventh Embodiment>

As described above, the calculation accuracy of an optical image (its intensity distribution) of the mask pattern can be improved by reducing $\Delta x$. However, a reduction in $\Delta x$ increases the number of constraints used to determine an effective light source, so the computation time may prolong. For this reason, an effective light source determination method which can improve the calculation accuracy of an optical image of the mask pattern while preventing prolongation of the computation time will be described in this embodiment.

Figure 14:
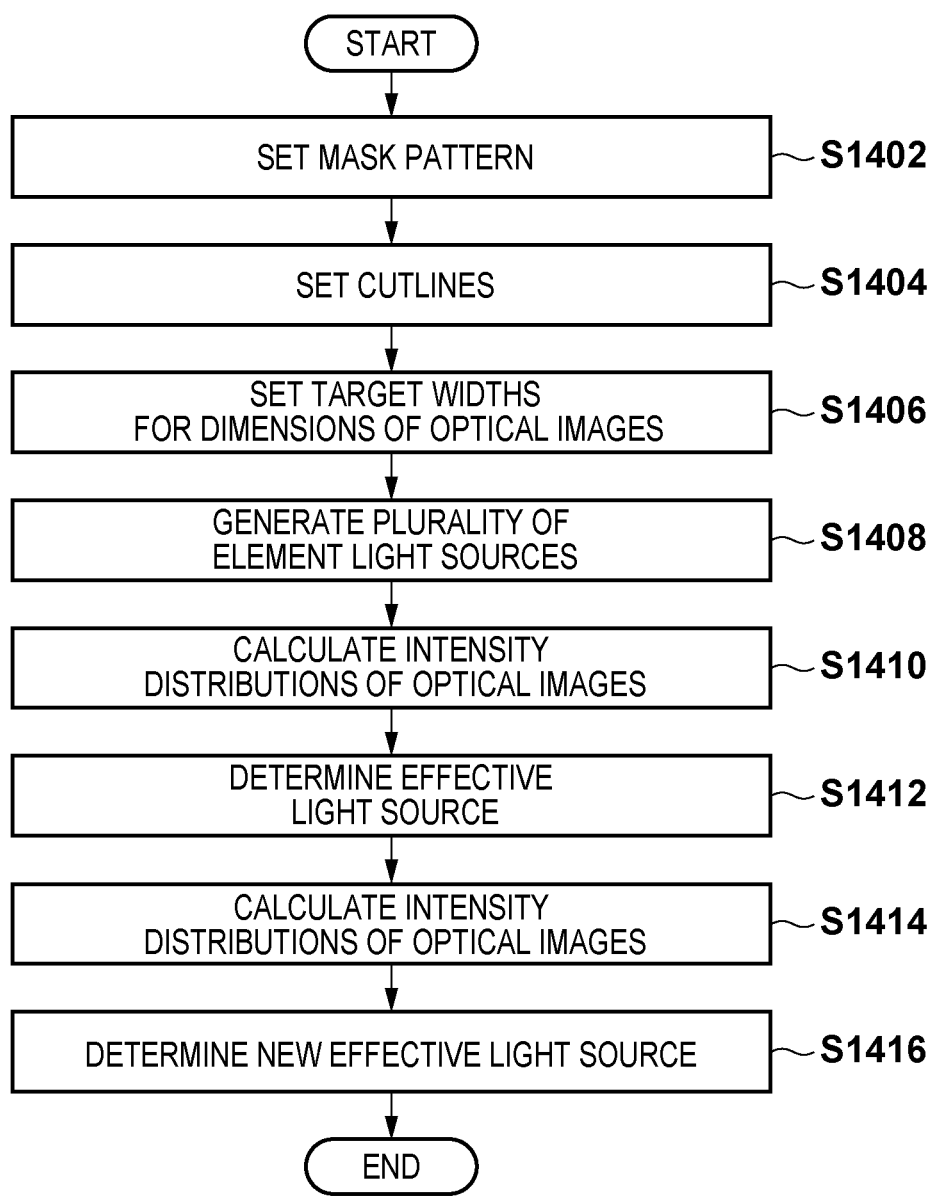
FIG. 14 is a flowchart for explaining a determination method according to another aspect of the present invention.

FIG. 14 is a flowchart for explaining a determination method according to another aspect of the present invention. This determination method includes steps S1414 and S1416, in addition to steps S1402 to S1412 that are the same as steps S102 to S112, respectively. In the determination method of this embodiment, calculation of an optical image of the mask pattern, which is formed on each cutline, is iterated using the effective light source determined in step S1412. More specifically, first, edge regions including the edges of an optical image of the mask pattern, which is formed on each cutline upon illuminating the mask pattern with the effective light source determined in step S1412, are specified in step S1414. An optical image of the mask pattern, which is formed on each cutline, is then calculated for each of the plurality of element light sources generated in step S1408. This is done such that the number (second number) of intensity data included in the edge region is larger than that (first number) of intensity data included in the edge region of the optical image of the mask pattern calculated in step S1410. In other words, the position (coordinate) on each cutline is re-divided so that an intensity is calculated for each of the second number of positions larger than the first number of positions included in the edge region of the optical image calculated in step S1410, thereby calculating an optical image of the mask pattern. Also, in step S1416, a new effective light source is determined based on the optical images calculated in step S1414. More specifically, a weight to be applied to each of the plurality of element light sources is determined such that the dimensions of optical images of the mask pattern, which are formed on the cutlines, come close to their target values, thereby determining, as a new effective light source, light sources obtained by combining the plurality of element light sources applied with the weights.

In this manner, in this embodiment, calculation of an optical image (its intensity distribution) of the mask pattern, which is formed on each cutline, and determination of an effective light source are iterated (a plurality of times), thereby narrowing the ranges of positions of the edges of the optical image. This makes it possible to improve the calculation accuracy of an optical image of the mask pattern while preventing prolongation of the computation time.

Figure 15:
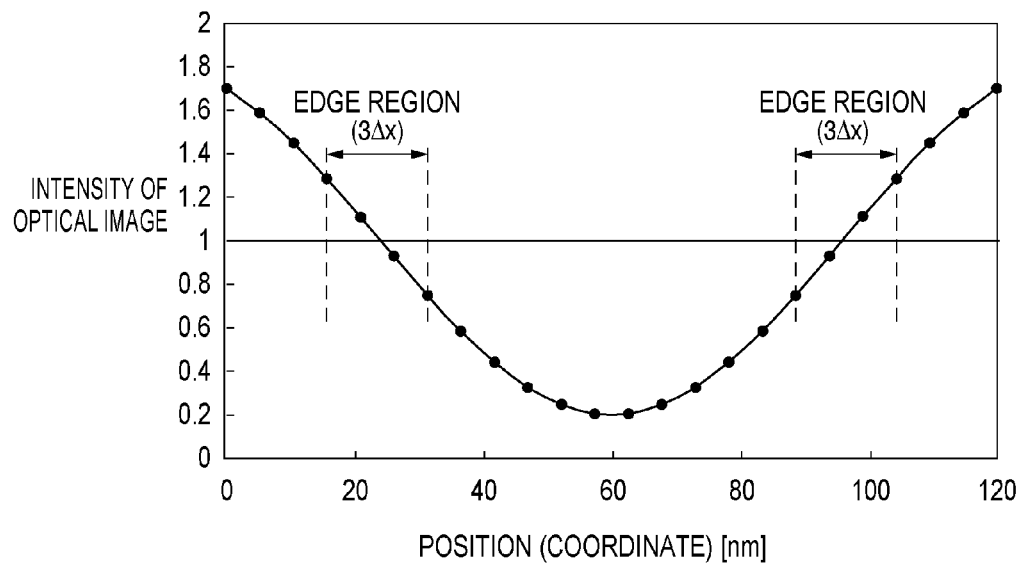
FIG. 15 is a graph showing the intensity distribution of an optical image of a mask pattern for an effective light source determined in step S1412 of the flowchart shown in FIG. 14.

An overview of repetition of calculation of an optical image (its intensity distribution), which is formed on each cutline, and determination of an effective light source, will be described herein. Assume, for example, that an intensity distribution, as shown in FIG. 15, is obtained as the intensity distribution of the optical image of the mask pattern for the effective light source determined in step S1412. At this time, attention is focused on a portion in which the intensity distribution of the optical image of the mask pattern crosses the slice level, that is, an interval Δx between adjacent positions having different values for the variable $u_{ij}$. Intensity distribution values (light intensities) are interpolated for an interval (edge region) which includes the interval Δx and has a specific width. Intervals for which intensity distribution values are interpolated exist on the right and left sides of the cutline, as shown in FIG. 15. In this embodiment, the position (coordinate) on the cutline is re-divided for each interval 3Δx. Although an interval for which intensity distribution values are interpolated may have a width of any multiple of the interval Δx, it desirably has a width three or more times that of the interval Δx in order to improve the computation accuracy.

Figure 16:
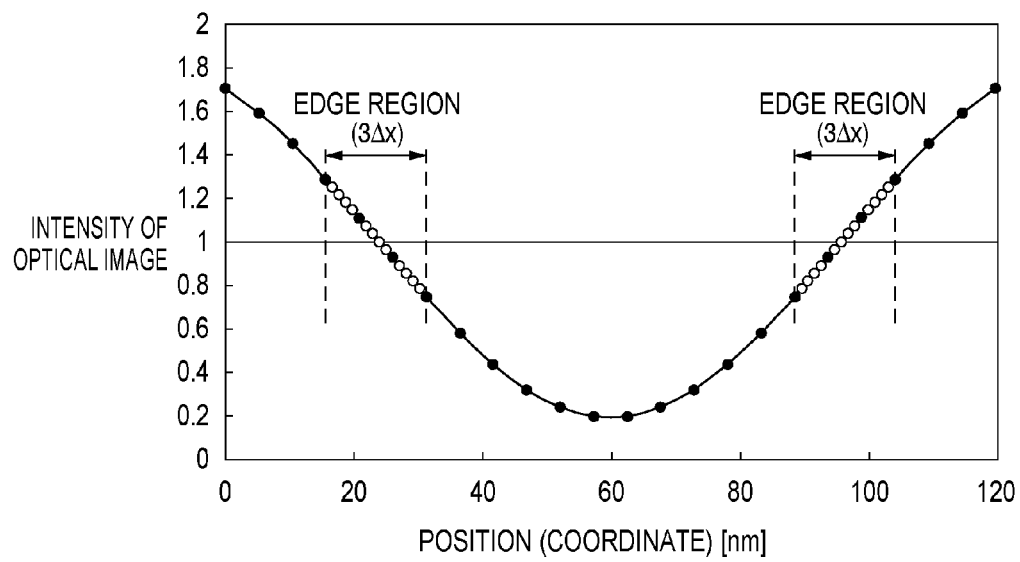
FIG. 16 is a graph showing the intensity distribution of the optical image of the mask pattern, which is calculated in step S1414 of the flowchart shown in FIG. 14.

FIG. 16 shows the result (that is, the intensity distribution of the optical image calculated in step S1414) of interpolating intensity distribution values (light intensities) for the interval 3Δk in the intensity distribution of the optical image of the mask pattern shown in FIG. 15. In FIG. 16, open circles indicate the interpolated intensity distribution values. In this manner, calculation of an optical image upon interpolating intensity distribution values which are not calculated in step S1410 is done for all of the plurality of element light sources.

Although the interval Δx is re-divided into five intervals in this embodiment, the interval Δx may be divided into any number of intervals. The interval Δx is preferably re-divided into four to eight intervals in consideration of the effect of improving both the computation time and the calculation accuracy. Also, although linear interpolation is used as an interpolation method in this embodiment, another interpolation method may be used or an optical image may be recalculated.

Figure 17:
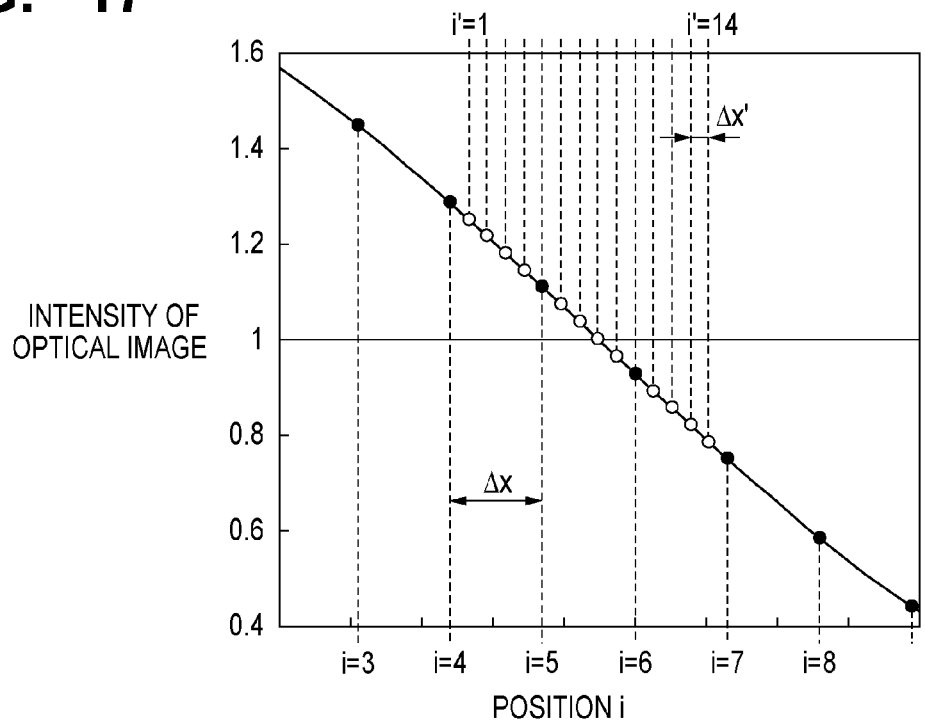
FIG. 17 is an enlarged graph showing the left interval (edge region) for which intensity distribution values are interpolated in the intensity distribution of the optical image of the mask pattern shown in FIG. 16.
Figure 18:
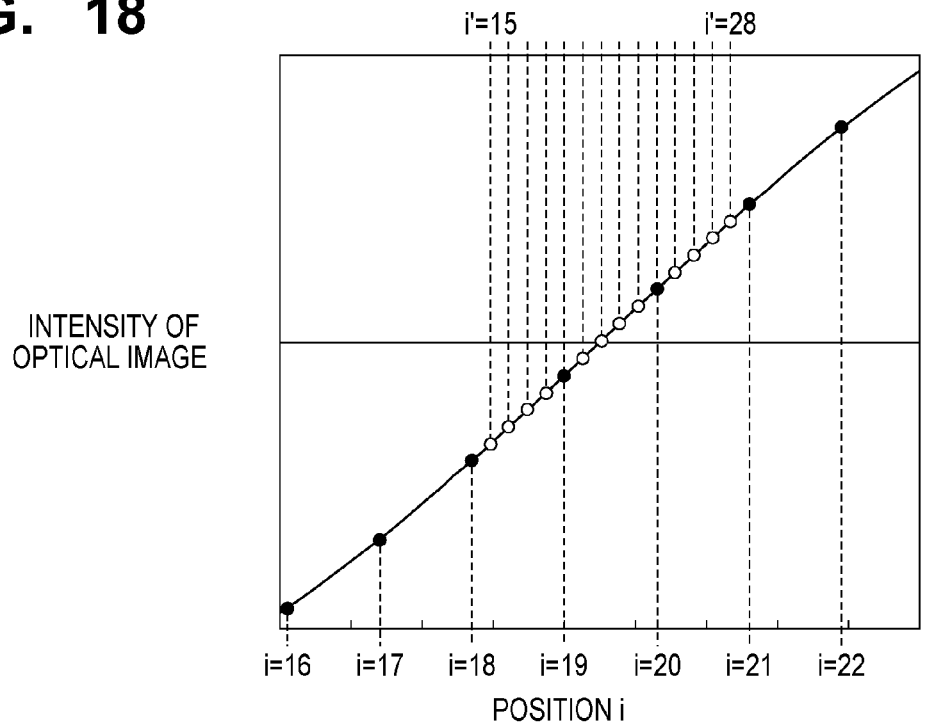
FIG. 18 is an enlarged graph showing the right interval (edge region) for which intensity distribution values are interpolated in the intensity distribution of the optical image of the mask pattern shown in FIG. 16.

FIGS. 17 and 18 are enlarged graphs showing the left and right intervals (edge regions), respectively, for which intensity distribution values are interpolated in the intensity distribution of the optical image of the mask pattern shown in FIG. 16. In FIGS. 17 and 18, let i' be the position (coordinate) obtained upon re-dividing the position i, and Δx' be the interval between the re-divided positions (coordinates). Referring to FIG. 17, the position i is re-divided for the interval from i=4 to i=7, including an interval Δx between adjacent positions having different values for the variable $u_{ij}$, that is, the interval between i=5 and 6. The re-divided position ranges from i'=1 to i'=14. Similarly, referring to FIG. 18, the position i is re-divided for the interval from i=18 to i=21, including an interval Δx between adjacent positions having different values for the variable $u_{ij}$, that is, the interval between i=19 and 20. The re-divided position ranges from i'=15 to i'=28.

Variables are defined for the positions i and i', respectively, and replacement with a mixed integer programming problem is performed, as in the first embodiment. However, positions i (i=5, 6, 19, and 20 in this embodiment) representing the same positions (coordinates) as specific positions i' are not included in the expressions.

Note that the previously obtained value of the variable $u_{ij}$ is set as a constant in repetition. In FIGS. 17 and 18, a variable $u_{ij}$=1 is set as a constant for i=4 or less or i=21 or more, and a variable $u_{ij}$=0 is set as a constant for i=7 to 18. This makes it possible to precisely recalculate only the interval between positions neighboring that (coordinate) which serves as a threshold for determination as to whether the resist dissolves.

Also, expressions corresponding to expressions (4) and (10) in expression group 1 can be derived from the target value Width, the intervals Δx and Δx', and the interval in which the intensity distribution value (light intensity) of the optical image is fixed to fall within the slice level (i=7 to 18 in FIGS. 17 and 18).

Although calculation of an optical image (its intensity distribution) of the mask pattern, which is formed on each cutline, and determination of an effective light source are iterated only once in this embodiment, they may be iterated any number of times.

Figure 19:
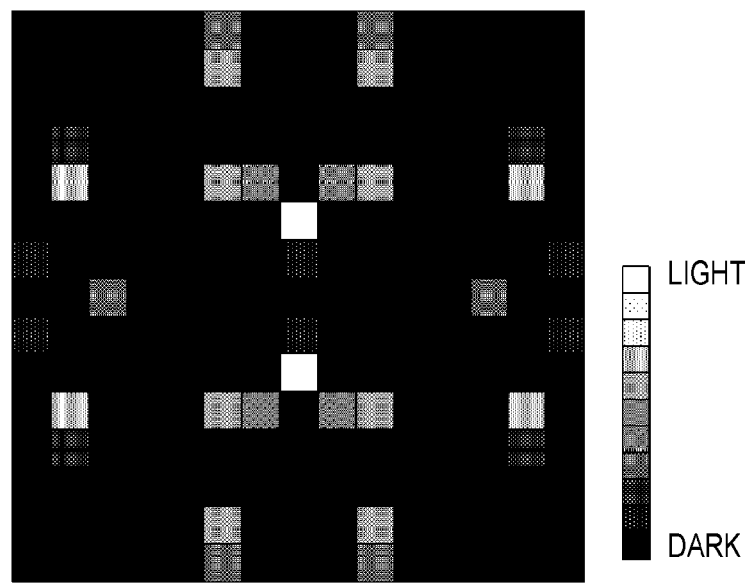
FIG. 19 is a view showing a new effective light source determined in step S1416 of the flowchart shown in FIG. 14.
Figure 20:
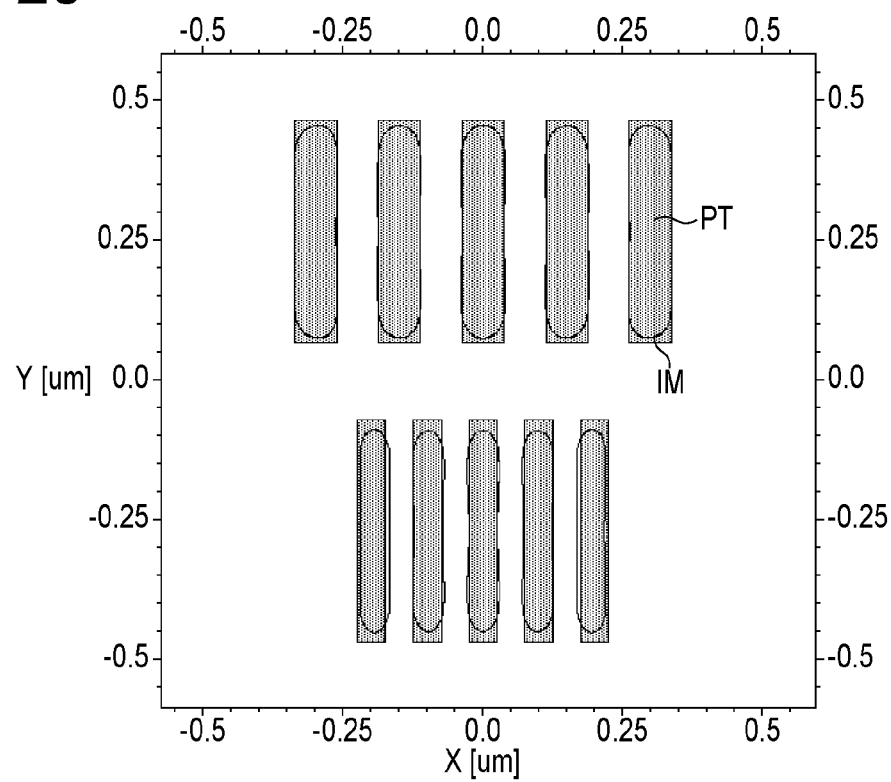
FIG. 20 is a view showing an optical image formed on the image plane of the projection optical system upon illuminating the mask pattern shown in FIG. 2 with the effective light source shown in FIG. 19.

FIG. 19 is a view showing the new effective light source determined in step S1416. FIG. 20 is a view showing an optical image formed on the image plane of the projection optical system upon illuminating the mask pattern shown in FIG. 2 with the effective light source shown in FIG. 19. In FIG. 20, reference symbol PT denotes a pattern group of the mask pattern; and IM, an optical image (the boundary line of a portion in which the resist remains behind). Table 6 shows the line widths of optical images of the mask pattern, which are formed on cutlines CL1 to CL6, respectively, at this time. As can be seen from a comparison between Tables 3 and 6, when calculation of an optical image of the mask pattern, and determination of an effective light source, is iterated, the line widths of optical images of the mask pattern, which are formed on the cutlines CL1 to CL6, respectively, further come close to their target values.

TABLE 6

| | Cutline | | | | | |
|---|---|---|---|---|---|---|
| | CL1 | CL2 | CL3 | CL4 | CL5 | CL6 |
| Line Width [nm] | 75.01 | 75.02 | 74.99 | 50.25 | 50.08 | 50.14 |

The importance of evaluating the dimension (line width) of the optical image of the pattern to determine (optimize) an effective light source, as has been described in the first to seventh embodiments, will be explained below with reference to FIGS. 21A and 21B. FIG. 21A is a view showing a mask pattern and an optical image of the pattern in a typical transistor isolation process. Also, FIG. 21B is an enlarged view of a region a shown in FIG. 21A. In FIG. 21B, reference symbol MP denotes a mask pattern; PI, an optical image of the pattern; and WD, the line width of the optical image of the pattern. As shown in FIG. 21B, the mask pattern MP has vertical asymmetry, so the optical image PI of the pattern shifts (generates a pattern shift) vertically with respect to the mask pattern MP, and therefore comes into contact with a gate (not shown) placed in its upper layer. The width WD of the optical image of the pattern contributes to the resistance value of a transistor, and thus requires control to a predetermined value. On the other hand, the optical image PI of the pattern poses no problem in terms of the performance of a device even if it shifts by several to several ten nanometers with respect to the mask pattern MP. Therefore, it is of prime importance to accurately control not the position of the optical image of the pattern but its line width, so the effective light source determination method (optimization) in this embodiment is more advantageous than the prior arts. Although a mask pattern in a transistor isolation process has been taken as an example herein, an effective light source is to be determined (optimized) assuming the line width of an optical image of the pattern as a target in the layout of an actual device in a wide variety of circumstances.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

<Eighth Embodiment>

Figure 22:
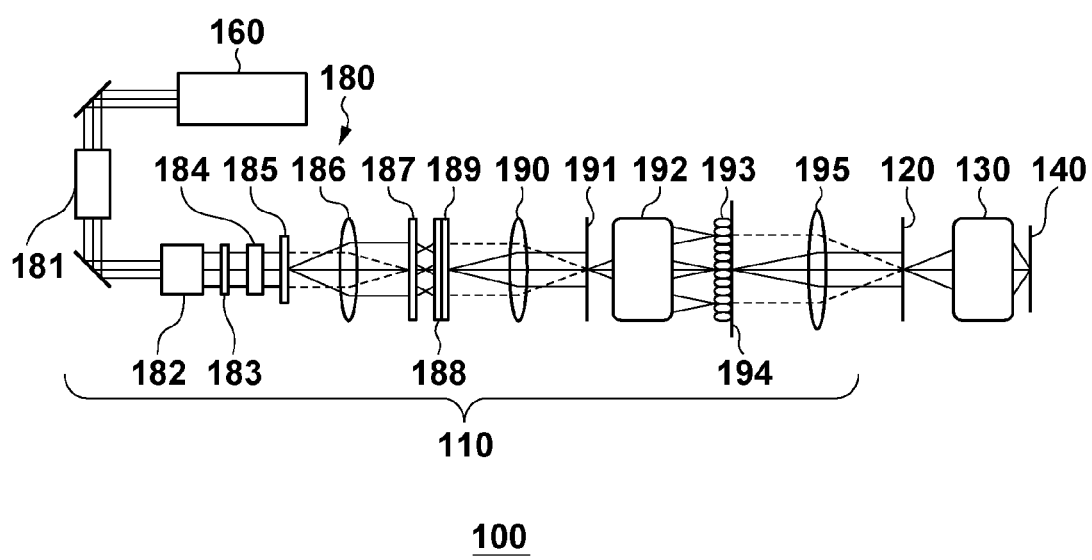
FIG. 22 is a schematic block diagram showing the arrangement of an exposure apparatus.

An exposure apparatus 100 which transfers the pattern of a mask illuminated with light from an illumination optical system onto a wafer will be described below with reference to FIG. 22. FIG. 22 is a schematic block diagram showing the arrangement of the exposure apparatus 100. The exposure apparatus 100 uses an illumination optical system 180 to form an effective light source determined by the above-mentioned determination method to illuminate the mask with the effective light source. Although the exposure apparatus 100 is of the step-and-scan type in this embodiment, it can also adopt the step-and-repeat type or another exposure type.

The exposure apparatus 100 includes an illumination device 110, a mask stage (not shown) which supports a mask 120, a projection optical system 130, and a wafer stage (not shown) which supports a wafer 140.

The illumination device 110 includes a light source 160 and the illumination optical system 180, and illuminates the mask 120 on which a circuit pattern to be transferred is formed. An excimer laser such as an ArF excimer laser having a wavelength of about 193 nm or a KrF excimer laser having a wavelength of about 248 nm, for example, is used as the light source 160. However, the types and number of light sources 160 are not particularly limited, and an $F_2$ laser having a wavelength of about 157 nm or a narrowband mercury lamp, for example, can also be used as the light source 160. The illumination optical system 180 illuminates the mask 120 with light from the light source 160, and forms an effective light source determined by the above-mentioned determination method. The illumination optical system 180 includes a routing optical system 181, beam shaping optical system 182, polarization control unit 183, phase control unit 184, exit angle control optical element 185, relay optical system 186, and multibeam generation unit 187. The illumination optical system 180 also includes a polarization state adjusting unit 188, computer generated hologram 189, relay optical system 190, aperture 191, zoom optical system 192, multibeam generation unit 193, aperture stop 194, and irradiation unit 195.

The routing optical system 181 deflects the light from the light source 160 to guide it to the beam shaping optical system 182. The beam shaping optical system 182 converts the aspect ratio of the cross-sectional shape of the light from the light source 160 into a predetermined value (converts this cross-sectional shape, for example, from a rectangle into a square). The beam shaping optical system 182 forms a light beam having a size and an angle of divergence that are required to illuminate the multibeam generation unit 187.

The polarization control unit 183 uses, for example, a linear polarizer, and has a function of eliminating unnecessary polarized components.

Minimizing the polarized components eliminated (shielded) by the polarization control unit 183 makes it possible to efficiently convert the light from the light source 160 into predetermined linearly polarized light. The phase control unit 184 generates a phase difference of $\lambda/4$ in the light, which is linearly polarized by the polarization control unit 183, to convert it into circularly polarized light. The exit angle control optical element 185 uses, for example, an optical integrator (for example, a fly-eye lens or fiber formed from a plurality of microlenses), and outputs the light at a predetermined angle of divergence. The relay optical system 186 focuses the light emerging from the exit angle control optical element 185 on the multibeam generation unit 187. The exit surface of the exit angle control optical element 185 and the incident surface of the multibeam generation unit 187 have a Fourier transform relationship (serve as an object plane and a pupil plane, respectively, or serve as a pupil plane and an image plane, respectively) by means of the relay optical system 186. The multibeam generation unit 187 uses an optical integrator used to uniformly illuminate the polarization state adjusting unit 188 and computer generated hologram 189. A secondary light source formed from a plurality of point light sources is formed on the exit surface of the multibeam generation unit 187. The light emerging from the multibeam generation unit 187 enters the polarization state adjusting unit 188 as circularly polarized light.

The polarization state adjusting unit 188 generates a phase difference of $\lambda/4$ in the light, which is circularly polarized by the phase control unit 184, to convert it into linearly polarized light having a predetermined polarization direction. The light emerging from the polarization state adjusting unit 188 impinges on the computer generated hologram 189 which functions as a diffraction optical element. Although the polarization state adjusting unit 188 is placed on the light source side with respect to the computer generated hologram 189 in this embodiment, the polarization state adjusting unit 188 and the computer generated hologram 189 may be interchanged with each other. Also, when the polarization state adjusting unit 188 uses an SWS (Sub-Wavelength Structure), it serves as a single device having the functions of both a polarization state adjusting unit and a diffraction optical element (that is, it integrates a diffraction optical element).

The computer generated hologram 189 forms an effective light source (light intensity distribution) determined by the above-mentioned determination method, such as an effective light source as shown in FIG. 4, at the position of the aperture 191 via the relay optical system 190. The computer generated hologram 189 can also form, for example, annular illumination and quadrupole illumination, and even implement, for example, tangential polarization and radial polarization in cooperation with the polarization state adjusting unit 188. A plurality of computer generated holograms 189 which form different effective light sources are placed on, for example, a switching unit such as a turret. A computer generated hologram 189 corresponding to an effective light source determined by the above-mentioned determination method is placed in the optical path of the illumination optical system 180, thereby making it possible to form various effective light sources.

The aperture 191 has a function of passing only the effective light source (light intensity distribution) formed by the computer generated hologram 189. The computer generated hologram 189 and the aperture 191 have a Fourier transform relationship. The zoom optical system 192 enlarges the effective light source formed by the computer generated hologram 189 to a predetermined magnification, and projects it onto the multibeam generation unit 193. The multibeam generation unit 193 is placed on the pupil plane of the illumination optical system 180, and forms, on its exit surface, a light source image (effective light source) corresponding to the light intensity distribution formed at the position of the aperture 191. In this embodiment, the multibeam generation unit 193 uses an optical integrator such as a fly-eye lens or a cylindrical lens array. Note that the aperture stop 194 is placed near the exit surface of the multibeam generation unit 193. The irradiation unit 195 includes, for example, a condenser optical system, and illuminates the mask 120 with the effective light source formed on the exit surface of the multibeam generation unit 193.

The mask 120 includes a circuit pattern (main pattern) to be transferred, and auxiliary patterns. The mask 120 is supported and driven by the mask stage (not shown). Light diffracted by the mask 120 is projected onto the wafer 140 via the projection optical system 130. Since the exposure apparatus 100 is of the step-and-scan type, it transfers the pattern of the mask 120 onto the wafer 140 by scanning them.

The projection optical system 130 projects the pattern of the mask 120 onto the wafer 140. A dioptric system, a catadioptric system, or a catoptric system can be used as the projection optical system 130.

The wafer 140 is a substrate onto which the pattern of the mask 120 is to be projected (transferred), and is supported and driven by the wafer stage (not shown). However, the wafer 140 can also be substituted by a glass plate or another substrate. The wafer 140 is coated with a resist.

In exposure, light from the light source 160 illuminates the mask 120 by means of the illumination optical system 180. The light which bears the information of the pattern of the mask 120 forms an image on the wafer 140 by means of the projection optical system 130. At this time, the mask 120 is illuminated with an effective light source determined by the above-mentioned determination method. Hence, the exposure apparatus 100 can provide high-quality devices (for example, a semiconductor device, an LCD device, an image sensing device (for example, a CCD), and a thin-film magnetic head) with a high throughput and good economic efficiency. These devices are fabricated through a step of exposing a substrate (for example, a wafer or glass plate) coated with a photoresist (sensitizer) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-196093 filed on Sep. 1, 2010, which is hereby incorporated by reference herein in its entirety.

What is claimed is:

1. A determination method of determining a light intensity distribution to be formed on a pupil plane of an illumination optical system which illuminates a mask in an exposure apparatus including the illumination optical system and a projection optical system which projects a pattern of the mask onto a substrate, the method comprising:

a first step of setting the pattern of the mask;

a second step of setting a cutline used to evaluate an image of the pattern of the mask, which is formed on an image plane of the projection optical system, and a target value of a dimension of the image;

a third step of setting a plurality of element light sources which form the light intensity distribution of the illumination optical system;

a fourth step of calculating an image of the pattern of the mask, which is formed on the cutline upon illuminating the pattern of the mask, for each of the plurality of element light sources; and a fifth step of determining a weight to be applied to each of the plurality of element light sources such that the dimension of the image of the pattern of the mask on the cutline from the images calculated in the fourth step comes close to the target value of the dimension, thereby determining, as the light intensity distribution to be formed on the pupil plane of the illumination optical system, light sources obtained by combining the plurality of element light sources applied with the weights.

2. The method according to claim 1, wherein in the fifth step, mixed integer programming is used to determine the light intensity distribution to be formed on the pupil plane of the illumination optical system such that the dimension of the image of the pattern of the mask on the cutline comes close to the target value thereof, the mixed integer programming uses a variable which takes a first integer value if an intensity of the image of the pattern of the mask exceeds a threshold, and takes a second integer value if the intensity of the image of the pattern of the mask does not exceed the threshold, and the variable is set for each of positions of the images of the pattern of the mask, which are calculated in the fourth step.

3. The method according to claim 1, further comprising:

a step of setting a plurality of defocus planes defocused from the image plane of the projection optical system, wherein in the fourth step, an image of the pattern of the mask formed at a position corresponding to the cutline set in the second step is calculated for each of the plurality of defocus planes as well, and in the fifth step, based on the image calculated for each of the plurality of defocus planes as well, a weight to be applied to each of the plurality of element light sources is determined such that the dimension, on the cut line corresponding to each of the plurality of defocus planes, of the image of the pattern of the mask comes close to the target value thereof, thereby determining, as the light intensity distribution to be formed on the pupil plane of the illumination optical system, light sources obtained by combining the plurality of element light sources applied with the weights.

4. The method according to claim 1, wherein the third step includes a step of generating proportional-multiplication element light sources obtained by proportionally multiplying intensities of the plurality of element light sources by a given factor, in the fourth step, an image of the pattern of the mask formed at a position corresponding to the cutline set in the second step is calculated for each of the proportional-multiplication element light sources as well, and in the fifth step, based on the image calculated for each of the proportional-multiplication element light sources as well, a weight to be applied to each of the plurality of element light sources is determined such that the dimension, on the cutline, of the image of the pattern of the mask comes close to the target value thereof, thereby determining, as the light intensity distribution to be formed on the pupil plane of the illumination optical system, light sources obtained by combining the plurality of element light sources applied with the weights.

5. The method according to claim 1, wherein
in the fourth step, an intensity of the image of the pattern of the mask is calculated for each of a first number of positions included in an edge region including an edge of the image, and the method further comprises:

a sixth step of specifying the edge region including the edge of the image of the pattern of the mask, which is formed on the cutline upon illuminating the pattern of the mask with the light intensity distribution determined in the fifth step, thereby calculating, for each of the plurality of element light sources generated in the third step, an image of the pattern of the mask, which is formed on the cutline, so that the intensity of the image is calculated for each of a second number of positions larger than the first number of positions in the specified edge region; and a seventh step of determining, based on the images calculated in the sixth step, a weight to be applied to each of the plurality of element light sources such that the dimension, on the cutline, of the image of the pattern of the mask comes close to the target value thereof, thereby determining, as the light intensity distribution to be formed on the pupil plane of the illumination optical system, light sources obtained by combining the plurality of element light sources applied with the weights.

6. An exposure method comprising the steps of:

illuminating a mask with light emitted by an illumination optical system which forms a light intensity distribution determined using a determination method defined in claim 1; and projecting an image of a pattern of the mask onto a substrate via a projection optical system.

7. A computer-readable storage medium storing a program for causing a computer to execute a determination method of determining a light intensity distribution to be formed on a pupil plane of an illumination optical system which illuminates a mask in an exposure apparatus including the illumination optical system and a projection optical system which projects a pattern of the mask onto a substrate, the program causing the computer to execute:

a first step of setting the pattern of the mask;

a second step of setting a cutline used to evaluate an image of the pattern of the mask, which is formed on an image plane of the projection optical system, and a target value of a dimension of the image;

a third step of setting a plurality of element light sources which form the light intensity distribution of the illumination optical system;

a fourth step of calculating an image of the pattern of the mask, which is formed on the cut line upon illuminating the pattern of the mask, for each of the plurality of element light sources; and a fifth step of determining a weight to be applied to each of the plurality of element light sources such that the dimension of the image of the pattern of the mask on the cutline from the images calculated in the fourth step comes close to the target value of the dimension, thereby determining, as the light intensity distribution to be formed on the pupil plane of the illumination optical system, light sources obtained by combining the plurality of element light sources applied with the weights.

* * * * *